(12) United States Patent
Tanishima

(10) Patent No.: US 7,295,039 B2
(45) Date of Patent: Nov. 13, 2007

(54) BUFFER CIRCUIT

(75) Inventor: Hideaki Tanishima, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 124 days.

(21) Appl. No.: 11/071,349

(22) Filed: Mar. 4, 2005

(65) Prior Publication Data

US 2006/0103423 A1    May 18, 2006

(30) Foreign Application Priority Data

Nov. 16, 2004    (JP)    ............................. 2004-331734

(51) Int. Cl.
*H03K 19/0175*    (2006.01)
(52) U.S. Cl. ......................................... 326/83; 326/63
(58) Field of Classification Search ............ 326/82–87, 326/63, 68–71
See application file for complete search history.

(56) References Cited

U.S. PATENT DOCUMENTS 5,021,691 A * 6/1991 Saito ............................ 326/69
5,757,225 A * 5/1998 Tobita ......................... 327/539
5,783,934 A * 7/1998 Tran ............................ 323/312

FOREIGN PATENT DOCUMENTS

JP    2004-7212    1/2004

* cited by examiner

*Primary Examiner*—Don Le
(74) *Attorney, Agent, or Firm*—Arent Fox LLP

(57) ABSTRACT

A buffer circuit for reducing leakage current and for protecting circuits from electrostatic discharge ("ESD"). A power supply circuit of an input/output buffer includes a transistor circuit connected to a high-potential power supply, a transistor circuit connected to a low-potential power supply, and a protection circuit connected between the two transistor circuits. The on-resistance of the transistor circuit is small. The transistor circuit generates a reference voltage close to the voltage of the high-potential power supply. The gate and source of the transistor circuits are connected to each other. This significantly reduces leakage current flowing from the reference voltage to the low-potential power supply. The protection circuit has resistance that lowers voltage at a high voltage terminal of the second transistor and reduces current flowing to the second transistor when a great amount of current flows through the first transistor circuit due to the occurrence of ESD.

25 Claims, 18 Drawing Sheets

BUFFER CIRCUIT

CROSS-REFERENCE TO RELATED APPLICATIONS

This application is based upon and claims the benefit of priority from prior Japanese Patent Application No. 2004-331734, filed on Nov. 16, 2004, the entire contents of which are incorporated herein by reference.

BACKGROUND OF THE INVENTION

The present invention relates to a buffer circuit such as an input/output buffer, an input buffer, and an output buffer.

Consumer demand has been increasing for personal computers and peripheral devices having lower power consumption. To meet this demand, circuits for personal computers and peripheral devices have been made more compact so that they can operate at lower voltages. A circuit operating under low voltage must be protected from the input of signals having a voltage greater than or equal to the operation voltage. Protection of a circuit that operates under a low voltage is also necessary when electric power is not supplied from a power supply.

Normally, a personal computer is connected to peripheral devices, such as a display, a mouse, a printer, a storage device, a modem, and game devices by a bus and an input/output (I/O) port. The bus may be categorized into an internal bus and an external bus. An internal bus connects the CPU and memory. An external bus connects the CPU and an I/O device (graphic board or SCSI board). Examples of an external bus are Industrial Standard Architecture (ISA), Peripheral Component Interconnect (PCI), Small Computer System Interface (SCSI), IEEE 1394, Universal Serial Bus (USB), and Integrated Drive Electronics (IDE; ATA (AT Attachment)).

An I/O port, which is an interface for connecting a personal computer and peripheral devices, generally includes an exclusive connector. Examples of an I/O port are a serial port connected to a mouse or a modem, a parallel port connected to a printer, and a game port connected to a game device.

In accordance with the lowered power consumption of electronic equipment, such as personal computers and peripheral devices, the operation voltage for an interface (I/O port) connected to electronic devices has been reduced. However, electronic devices include a plurality of circuits operating at different voltages. The I/O ports of such electronic devices include an input/output buffer applicable to the input of a voltage signal of which voltage is greater than the operation voltage.

For example, when an I/O port is connected to a joy stick device, the operation voltage of the input/output buffer is 3.3 V. Further, a voltage signal of 5 V for operating the joy stick device is provided to the input terminal of the input/output buffer. Therefore, the input/output buffer must be applicable to the input of the voltage signal (5 V), which is greater than the operation voltage (3.3 V).

Japanese Laid-Open Patent Publication No. 2004-7212 describes an input/output buffer capable of protecting circuits from an externally provided voltage signal irrespective of whether or not operation power is supplied.

The input/output buffer includes a power supply circuit 1 for converting the externally provided voltage signal to a suitable reference voltage corresponding to the voltage of a high-potential power supply. As shown in FIG. 1, the power supply circuit 1 includes diode connected P-channel MOS transistors Pt11 to Pt15. The back gate of each of the transistors Pt11 to Pt15 is connected to a node having a voltage differing from the voltages of a high-potential power supply VDE and a low-potential power supply VSS. When a voltage signal EB is received from an external device, the transistors Pt11 to 15 prevent high voltage from being applied between the gate and the back gate of the transistors Pt 11 to Pt15 irrespective of whether or not power is being supplied from the high-potential power supply VDE.

The power supply circuit shown in FIG. 1 includes a plurality of series-connected N-channel MOS transistors Nt9 to Nt12. Each transistor Nt9 to Nt12 includes a gate and a drain, which are connected to each other. The transistors Nt9 to Nt12 and a transistor circuit Pt10 configure a route (DC path) through which direct current flows between the high-potential power supply VDE and the low-potential power supply VSS. The flow of a slight amount of current through the DC path prevents the operation of the power supply circuit from being unstable. However, the slight amount of current (leakage current) flowing through the DC path becomes a hindrance in reducing power consumption.

A power supply circuit 2 shown in FIG. 2 has been proposed to reduce leakage current and enable miniaturization. In FIG. 2, "Diode" denotes a plurality of diode-connected transistors, that is, the transistors Pt11 to Pt15 and a resistor R2 as shown in FIG. 1.

The power supply circuit 2 includes a transistor circuit Nt13 having a gate and a source that are connected to each other. This configuration reduces leakage current. Further, the power supply circuit 2 of FIG. 2 is more compact than the power supply circuit 1 shown in FIG. 1.

SUMMARY OF THE INVENTION

The transistor circuit Pt10 is configured so as to have a small on-resistance to reduce the voltage difference to a small amount between the high-potential power supply VDE and the reference voltage VD0. For example, the transistor circuit Pt10 has a multi-finger configuration configured by a plurality of (e.g., 40) parallel-connected transistors having gates connected to one another.

In this configuration, when electrostatic discharge (ESD) is produced, a large amount of current flows to the transistor circuit Pt10. The current flowing to the plurality of transistors configuring the transistor circuit Pt10 flows from node N4 to a single transistor circuit Nt13 and connects the source and drain of the transistor circuit Nt13. This causes damage (ESD damage) to the transistor circuit Nt13.

One aspect of the present invention is a buffer circuit for use with high-potential and low-potential power supplies. The buffer circuit includes a power supply circuit for generating operation voltage. The power supply circuit includes a first transistor circuit, connected to the high-potential power supply, having an on-resistance adjusted to be relatively small. A second transistor, connected between the first transistor circuit and the low-potential power supply, includes a gate and a source connected to each other. The operation voltage is the voltage at a node between the first transistor circuit and the second transistor circuit. A protection circuit, connected between the first transistor circuit and the second transistor circuit, has sufficient resistance for reducing current flowing to the second transistor circuit.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

An input/output buffer 11 according to a preferred embodiment of the present invention will now be described with reference to FIGS. 3 to 12.

Figure 1:
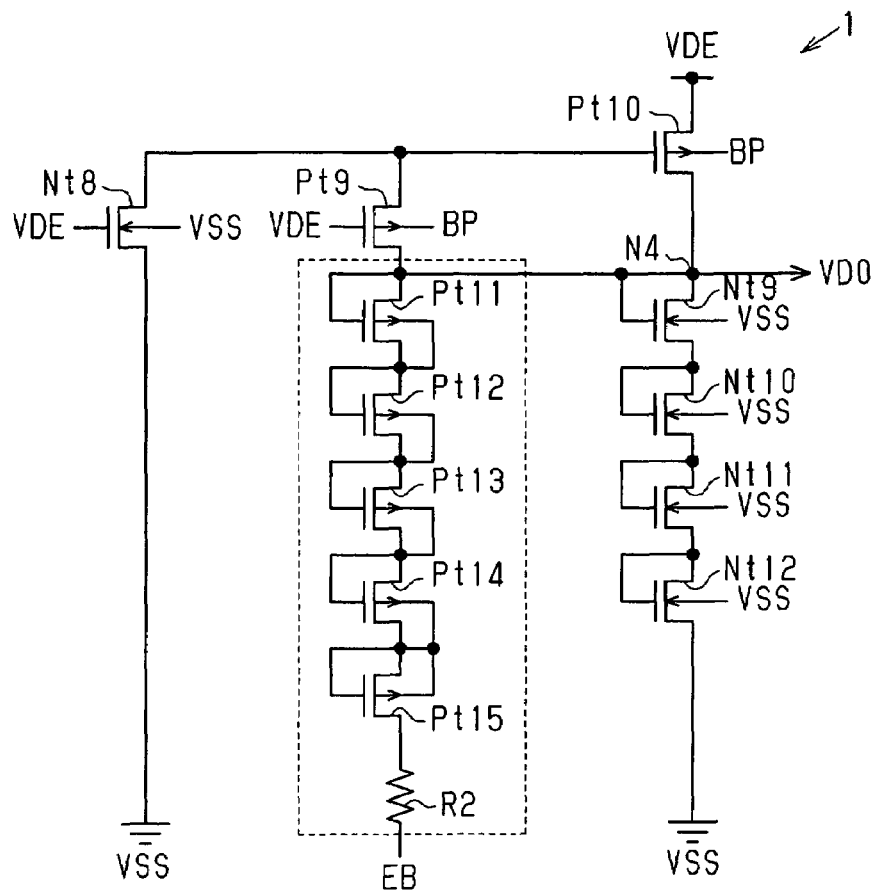
FIGS. 1 and 2 are circuit diagrams of power supply circuits in the prior art.
Figure 2:
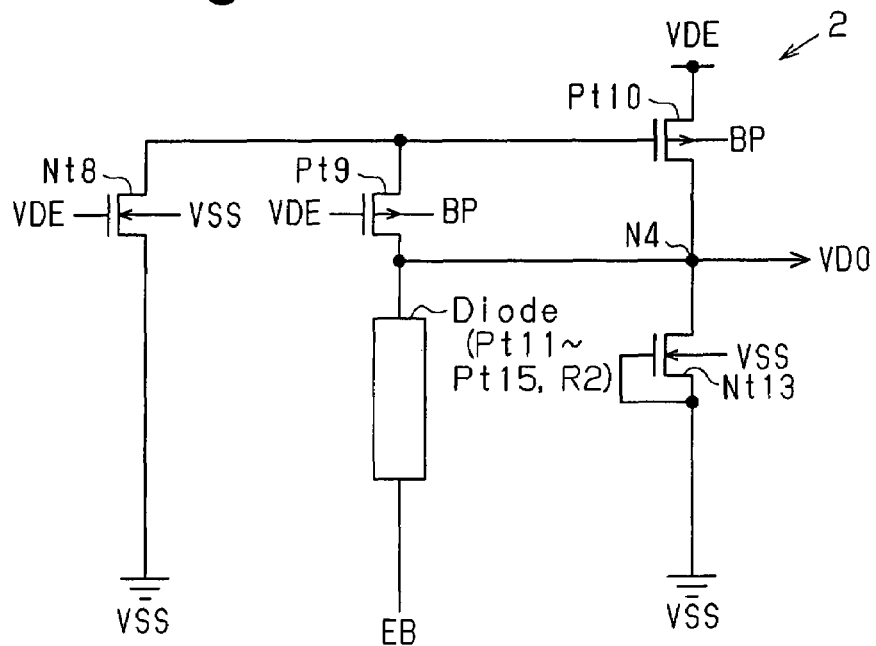
Figure 3:
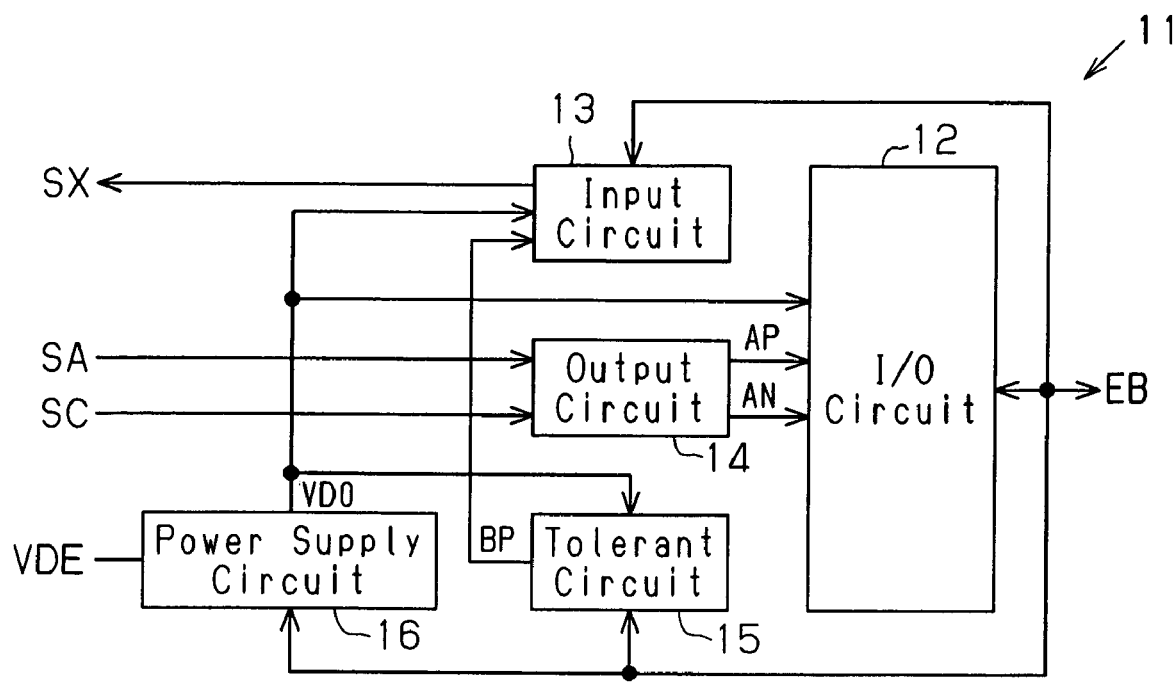
FIG. 3 is a block circuit diagram of an input/output buffer according to a preferred embodiment of the present invention.

As shown in FIG. 3, the input/output buffer 11 operates as an input buffer or an output buffer in accordance with a control signal SC provided from an internal circuit (not shown).

When the input/output buffer 11 operates as the output buffer, the input/output buffer 11 outputs a voltage signal EB corresponding to the output signal SA provided from the internal circuit in accordance with the control signal SC provided from the internal circuit (not shown). When operating as the input buffer, the input/output buffer 11 provides the internal circuit with a signal SX corresponding to voltage signal EB provided from an external device.

Voltage is supplied to the input/output buffer 11 from a first high-potential power supply VDE. The first high-potential power supply VDE supplies an operation voltage of 3.3 V to an external circuit connected to, for example, the input/output buffer 11. The input/output buffer 11 operates as the input buffer or the output buffer depending on the voltage of the first high-potential power supply VDE. When voltage is not supplied from the first high-potential power supply VDE, the input/output buffer 11 operates as the input buffer based on the reference voltage VD0 generated based on the voltage signal EB, which is provided from an external device.

The input/output buffer 11 includes an input/output circuit 12, an input circuit 13, an output circuit 14, a tolerant circuit 15, and a power supply circuit 16.

The input/output circuit 12 outputs to an external device the voltage signal EB having a voltage corresponding to operation power (reference voltage). The power supply circuit 16 generates an operation power (reference voltage) of the input/output buffer 11. The power supply circuit 16 supplies the reference voltage VD0 generated in accordance with the voltage of the voltage signal EB to the input/output circuit 12, the input circuit 13, and the tolerant circuit 15. The tolerant circuit 15 generates a voltage signal BP having a voltage corresponding to the voltage signal EB. The input circuit 13, based on the reference voltage VD0, adjusts the potential of the voltage signal EB (external input signal) to an appropriate potential to generate the signal SX and provides the signal SX to the internal circuit.

The output circuit 14 generates control signals AP and AN, based on the output control signal SC, and provides the control signals AP and AN to the input/output circuit 12 in response to the input of the data signal SA. The input/output circuit 12 generates and outputs the voltage signal EB in response to the control signals AP and AN.

Each circuit of the input/output buffer 11 will now be described. The configuration and operation of the output circuit 14 are well known in the art and thus will not be described.

Figure 4:
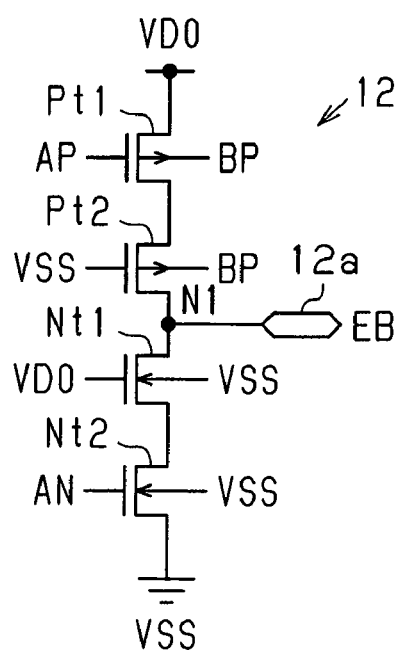
FIG. 4 is a diagram of an input/output circuit shown in FIG. 3.

As shown in FIG. 4, the input/output circuit 12 includes P-channel MOS transistors Pt1 and Pt2 and N-channel MOS transistors Nt1 and Nt2.

The reference voltage VD0 from the power supply circuit 16 is supplied to the source of the transistor Pt1. The control signal AP from the output circuit 14 is provided to the gate of the transistor Pt1. The drain of the transistor Pt1 is connected to the transistor Pt2. The source of the transistor Pt2 is connected to the transistor Pt1, the gate of the transistor Pt2 is connected to the low-potential power supply VSS (0 volts in the preferred embodiment), and the drain of the transistor Pt2 is connected to the transistor Nt1. The back gates of the transistors Pt1 and Pt2 are connected to the output terminal of the tolerant circuit 15 and have substantially the same voltage as the voltage of the voltage signal BP generated in the tolerant circuit 15. The drain of the transistor Nt1 is connected to the transistor Pt2. The reference voltage VD0 generated in the power supply circuit 16 is supplied to the gate of the transistor Nt1. The source of the transistor Nt1 is connected to the transistor Nt2. The drain of the transistor Nt2 is connected to the transistor Nt1. The control signal AN output from the output circuit 14 is input to the gate of the transistor Nt2. The source of the transistor Nt2 is connected to the low-potential power supply VSS. The back gates of the transistors Nt1 and Nt2 are connected to the low-potential power supply VSS. The node N1 between the transistor Pt2 and the transistor Nt1 is connected to the input/output terminal 12a of the voltage signal EB.

Therefore, when reference voltage VD0 is being supplied to the input/output circuit 12, the transistor Pt1 is turned ON and the transistor Nt2 is turned OFF based on the control signals AP and AN having an L level (voltage of low-potential power supply VSS) provided from the output circuit 14. In this case, the input/output circuit 12 outputs the voltage signal EB having the voltage of the reference voltage VD0.

Based on the control signals AP and AN having an H level (voltage of high-potential power supply VDE), the transistor Pt1 is turned OFF and the transistor Nt2 is turned ON. In this case, the input/output circuit 12 outputs the voltage signal EB having the voltage of the low-potential power supply VSS.

The transistors Pt1 and Nt2 are both turned OFF based on the control signal AP having an H level and the control signal AN having an L level. In this case, the input/output circuit 12 causes the node N1 to be in a high-impedance state.

Figure 5:
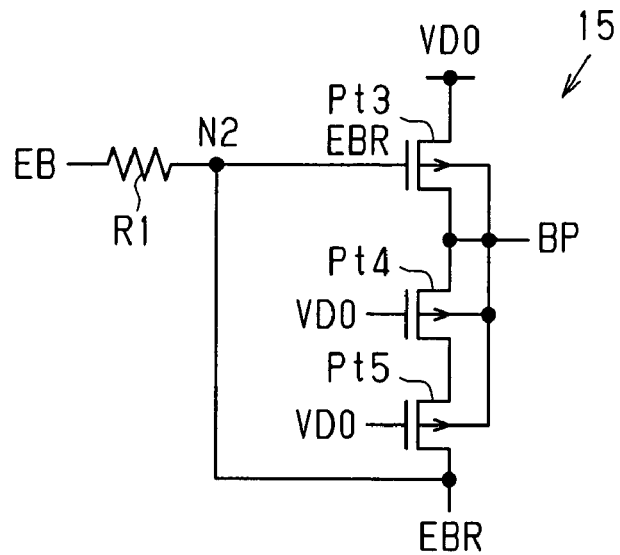
FIG. 5 is a circuit diagram of a tolerant circuit shown in FIG. 3.

FIG. 5 is a circuit diagram showing the configuration of the tolerant circuit 15 in detail.

The tolerant circuit 15 includes a protection resistor R1 and P-channel MOS transistors Pt3 to Pt5.

The resistor R1 is connected between the node N1 (input/output terminal 12a) of the input/output circuit 12 in FIG. 4 and the gate of the transistor Pt3. The voltage signal EB (external input signal) is converted by the resistor R1 to a voltage signal EBR having a lower voltage. The voltage signal EBR is input to the gate of the transistor Pt3. The reference voltage VD0 is input to the source of the transistor Pt3. The drain of the transistor Pt3 is connected to the transistor Pt4. The transistors Pt4 and Pt5 are connected in series. That is, the source of the transistor Pt4 is connected to the transistor Pt3, and the drain of the transistor Pt4 is connected to the transistor Pt5. The source of the transistor Pt5 is connected to the transistor Pt4, and the drain of the transistor Pt5 is connected to a node N2 between the resistor R1 and the transistor Pt3. Accordingly, the gate voltage (voltage signal EBR) of the transistor Pt3 is input to the drain of the transistor Pt5.

The reference voltage VD0 generated in the power supply circuit 16 is input to the gates of the transistors Pt4 and Pt5. The back gate of each transistor Pt3 to Pt5 is connected to a node between the transistor Pt3 and the transistor Pt4. The voltage signal BP having the voltage of that node is output from the tolerant circuit 15.

Figure 6:
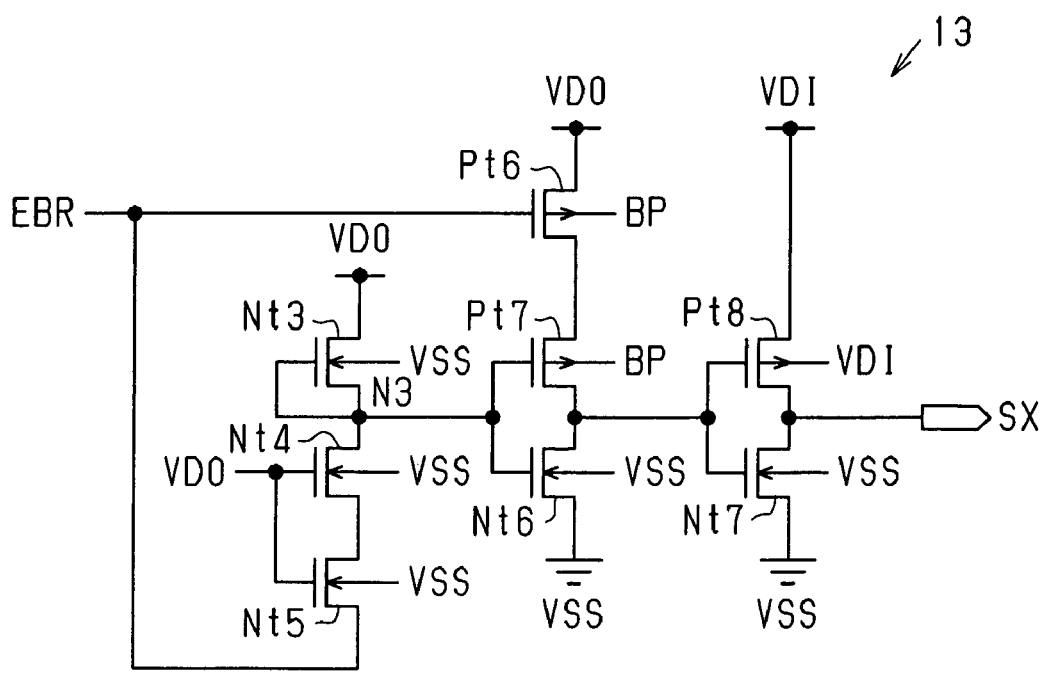
FIG. 6 is a circuit diagram of an input circuit shown in FIG. 3.

As shown in FIG. 6, the input circuit 13 includes P-channel MOS transistors Pt6 to Pt8 and N-channel MOS transistors Nt3 to Nt7. The reference voltage VD0 generated in the power supply circuit 16 is input to the drain of the transistor Nt3. The source and the gate of the transistor Nt3 are connected to each other. The transistors Nt4 and Nt5 are connected in series. The reference voltage VD0 is supplied to the gates of the transistors Nt4 and Nt5. The source of the transistor Nt5 is connected to the node N2 between the resistor R1 and the transistor Pt3 in the tolerant circuit 15 shown in FIG. 5. That is, the voltage signal EBR is input to the source of the transistor Nt5. The voltage of that source is the same as the gate voltage of the transistor Pt3.

The drain of the transistor Nt4 is connected to the source of the transistor Nt3. A node N3 between the transistor Nt3 and the transistor Nt4 is connected to the transistors Pt7 and Nt6. The back gate of each transistor Nt3 to Nt5 is connected to the low-potential power supply VSS.

The reference voltage VD0 is input to the source of the transistor Pt6, the gate of the transistor Pt6 is connected to the node N2 shown in FIG. 5, and the drain of the transistor Pt6 is connected to the transistor Pt7. That is, the gate voltage (voltage signal EBR) of the transistor Pt3 is input to the gate of the transistor Pt6. The source of the transistor Pt7 is connected to the transistor Pt6, the drain of the transistor Pt7 is connected to the transistor Nt6, and the gate of the transistor Pt7 is connected to the node N3. The source of the transistor Nt6 is connected to the low-potential power supply VSS, the drain of the transistor Nt6 is connected to the transistor Pt7, and the gate of the transistor Nt6 is connected to the node N3. The back gates of the transistors Pt6 and Pt7 have substantially the same voltage as the voltage of the voltage signal BP generated in the tolerant circuit 15 shown in FIG. 5. The back gate of the transistor Nt6 is connected to the low-potential power supply VSS.

A node between the transistor Pt7 and the transistor Nt6 is connected to the gates of the transistors Pt8 and Nt7. That is, the drain voltage of the transistors Pt7 and Nt6 is input to the gates of the transistors Pt8 and Nt7. The source and the back gate of the transistor Pt8 are connected to a second high-potential power supply VD1. The drain of the transistor Pt8 is connected to the transistor Nt7. The source and the back gate of the transistor Nt7 are connected to the low-potential power supply VSS. The drain of the transistor Nt7 is connected to the transistor Pt8. The second high-potential power supply VD1 generates, for example, the operation voltage of the internal circuit. In the preferred embodiment, the voltage of the second high-potential power supply VD1 is 1.8 V. The signal SX having the voltage of the node between the transistor Pt8 and the transistor Nt7 (drain voltage of the transistor Pt8 and the transistor Nt7) is output to the internal circuit (not shown).

Figure 7:
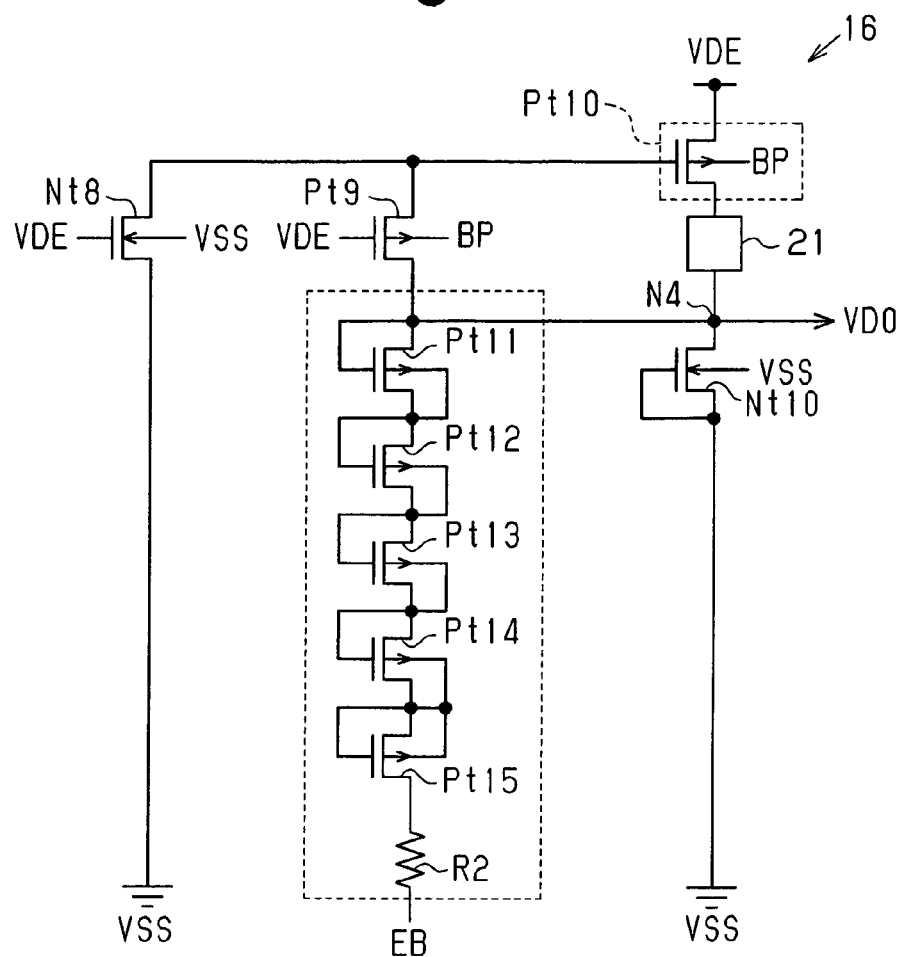
FIG. 7 is a circuit diagram of a power supply circuit shown in FIG. 3.

As shown in FIG. 7, the power supply circuit 16 includes P-channel MOS transistors Pt9 to Pt15, N-channel MPS transistors Nt8 and Nt13, a resistor R2, and a protection circuit 21.

The drain of the transistor Nt8 is connected to the transistor circuit Pt10 (first transistor circuit). The source and the back gate of the transistor Nt8 are connected to the low-potential power supply VSS. The gate of the transistor Nt8 is connected to the high-potential power supply VDE.

The source of the transistor Pt9 is connected to the transistor circuit Pt10. The drain of the transistor Pt9 is connected to the series-connected transistors Pt11 to 15. The gate of the transistor Pt9 is connected to the high-potential power supply VDE. The back gate of the transistor Pt9 has substantially the same voltage as the voltage of the voltage signal BP.

The transistors Pt11 to Pt15 are connected so as to function as a diode. The transistor Pt15 is connected in a direction opposite the connection direction of the transistors Pt11 to Pt14. The resistor R2 for protecting the transistor Pt15 from the electrostatic discharge (ESD) is connected to the drain of the transistor Pt15. The voltage signal EB is input to the drain of the transistor Pt15 via the resistor R2.

The transistor circuit Pt10 includes a source (first terminal) connected to the high-potential power supply VDE, a drain (second terminal) connected to a node between the transistor Pt9 and the transistor Pt11 via the protection circuit 21, a gate connected to the transistor Nt8 and the transistor Pt9, and a back gate having substantially the same voltage as the voltage of the voltage signal BP. The transistor circuit Nt13 (second transistor circuit) includes a source and a gate connected to the low-potential power supply VSS, and a drain connected to the transistor circuit Pt10. The power supply circuit 16 outputs the reference voltage VD0 having the same voltage as the voltage of a node N4 between the transistor circuit Pt10 and the transistor circuit Nt13.

The diode-connected (connected so as to function as a diode) transistors Pt11 to Pt15 function as a protection circuit.

Specifically, the transistor Pt11 includes a source and a gate connected to each other, as well as a drain and a back gate connected to each other. The transistors Pt12 to 14 are connected in the same manner as the transistor Pt11. The transistor Pt15 is connected in a direction opposite the transistor Pt11, that is, the source, the gate, and the back gate are connected to each other. Each of the transistors Pt11 to Pt15 is a P-channel MOS transistor. Thus, a PN junction is formed between the N-type region, which is either the source or the drain, and the N-well. Therefore, the transistors Pt11 to Pt15 function as a diode. The transistor Pt 15 forms a PN junction in the direction opposite the direction of the PN junction in the transistors Pt11 to Pt14. Each of the transistors Pt11 to Pt14 is connected in the forward direction (PN) with respect to the reference voltage VD0. The transistor Pt15 is connected in the opposite direction of the transistors Pt11 to Pt14. In other words, the transistors Pt11 to Pt15 are diode-connected so as to be in the order of "PN-PN-PN-PN-NP" from the reference voltage VD0. Therefore, the transistors Pt11 to 15 function as a protection circuit.

Specifically, when power is not being supplied to the input/output buffer 11 (i.e., when the high-potential power supply VDE is substantially 0 V), the transistor Nt8 is turned OFF, and the transistor Pt9 is turned ON. The transistor circuit Pt10 is thus turned OFF, and the power supply circuit 16 generates the reference voltage VD0 having voltage corresponding to the input voltage signal EB.

For example, when the power supply circuit 16 receives the voltage signal EB having substantially the same voltage as the low-potential power supply VSS, the power supply circuit 16 generates the reference voltage VD0 of the voltage (0 V), which is same as the low-potential power supply VSS. When the power supply circuit 16 receives the voltage signal EB having substantially the same voltage (approximately 3.3 V) as the high-potential power supply VDE, the voltage of such voltage signal EB is lowered by the transistors Pt11 to Pt15, and the reference voltage VD0 of, for example, 2.07 V, is generated. When the power supply circuit 16 receives the voltage signal EB having voltage (e.g., 6 V) higher than the high-potential power supply VDE, the voltage of the voltage signal EB is lowered by the transistors Pt11 to Pt15, and the reference voltage VD0 (e.g., 3.62 V) is generated. In this manner, the power supply circuit 16 generates the reference voltage VD0 of approximately 3 V even if the voltage signal EB is input when voltage of the power supply (high-potential power supply VDE) is not supplied.

The protection circuit 21 is connected between the transistor circuit Pt10 and the transistor circuit Nt13 (between the transistor circuit Pt10 and the node N4 in the preferred embodiment). The protection circuit 21 reduces the amount of current flowing to the transistor circuit Nt13 via the transistor circuit Pt10 when ESD occurs.

Figure 8:
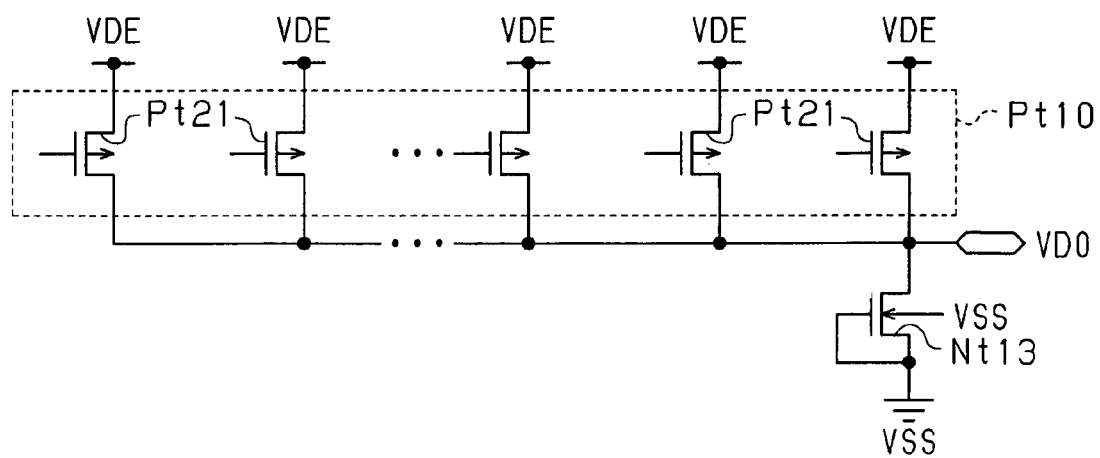
FIG. 8 is a schematic diagram of a transistor.
Figure 9:
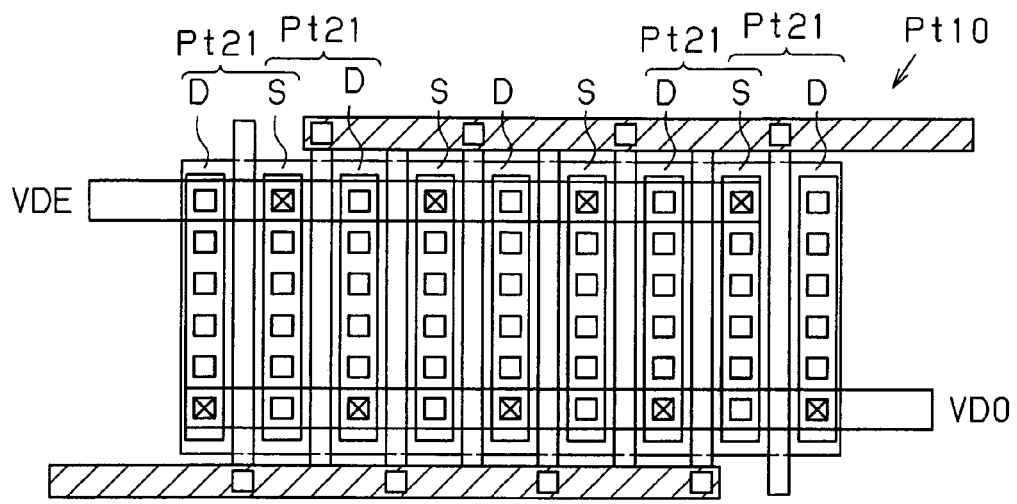
FIG. 9 is a diagram showing the layout of a transistor having a multi-finger configuration.

The voltage difference of the high-potential power supply VDE and the reference voltage VD0 is small. Thus, the on-resistance of the transistor circuit Pt10 is small. For example, the transistor circuit Pt10 is configured by a plurality of (m number of) P-channel MOS transistors Pt21, as shown in FIG. 8. The gates of these transistors Pt21 are commonly connected to the transistor Nt8 and the transistor Pt9 shown in FIG. 7. The resistance between the high-potential power supply VDE and the node N4 is small due to the transistors Pt21 that are connected in parallel between the high-potential power supply VDE and the node N4. The transistor circuit Pt10 has a multi-finger configuration including an m number of transistors in which a plurality of gate wires G are arranged in parallel and wired in a comb-shaped manner. In the transistor circuit Pt10, adjacent transistors Pt21 share the same source diffusion region S and drain diffusion region D. This decreases the area occupied by the transistor circuit Pt10.

Figure 10:
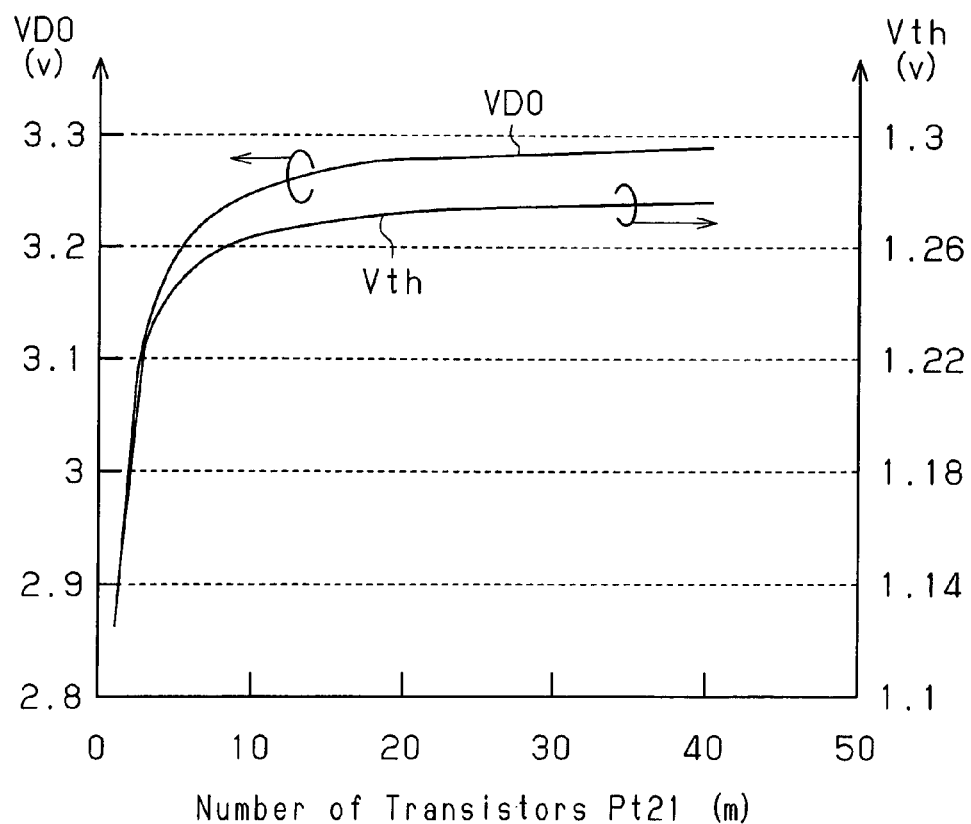
FIG. 10 is an operation characteristic graph of the power supply circuit.

FIG. 10 is a characteristic graph of the power supply circuit 16 showing the reference voltage VD0 and a threshold voltage Vth with respect to the number (parallel number: m) of transistors configuring the transistor circuit Pt10. The threshold voltage Vth shows the threshold voltage in the entire input/output buffer 11. The parallel number of the transistor circuit Pt10 is set so that the voltage of the reference voltage VD0 is close to the high-potential power supply VDE, and the threshold voltage is greater than or equal to a predetermined value. For example, the parallel number is set so that the voltage of the reference voltage VD0 is greater than or equal to 3.28 V, and the threshold voltage Vth is greater than or equal to 1.26 V. In the preferred embodiment, m represents 40.

Figure 11:
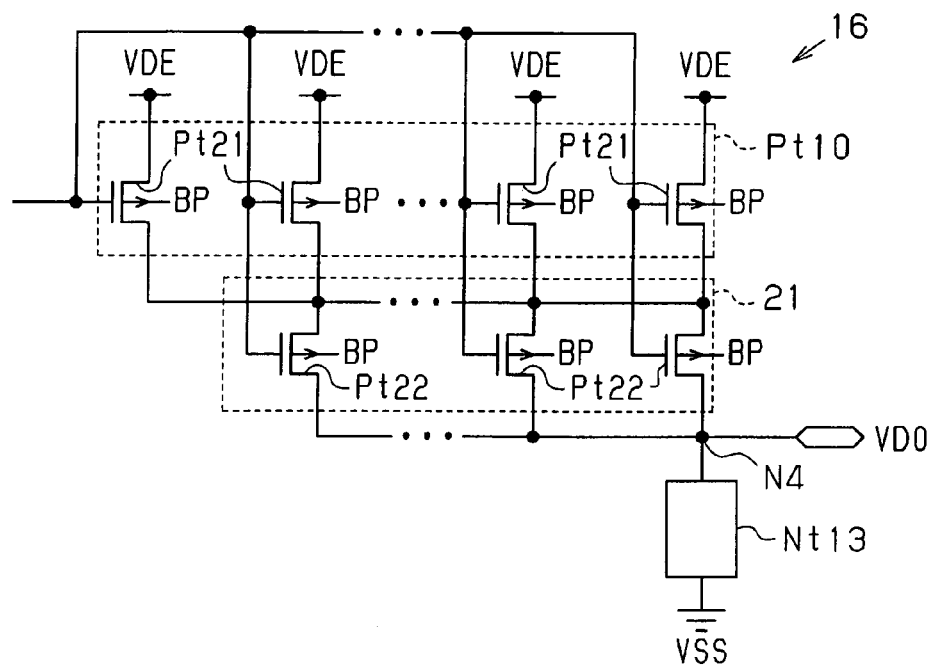
FIG. 11 is a partial circuit diagram of the power supply circuit.

As shown in FIG. 11, the protection circuit 21 is configured by a plurality of (n number of) P-channel MOS transistors Pt22.

The plurality of transistors Pt22 are configured in the same manner as the transistors Pt21 configuring the transistor circuit Pt10. That is, the gates of the plurality of transistors Pt22 configuring the protection circuit 21 are commonly connected to the transistor Nt8 and the transistor Pt9 shown in FIG. 7. Each transistor Pt22 includes a source and a drain connected to each other. The plurality of transistors Pt22 are connected in parallel to one another. Therefore, in the same manner as the transistors Pt21 configuring the transistor circuit Pt10, the transistors Pt22 formed a multi-finger configuration.

Figure 12:
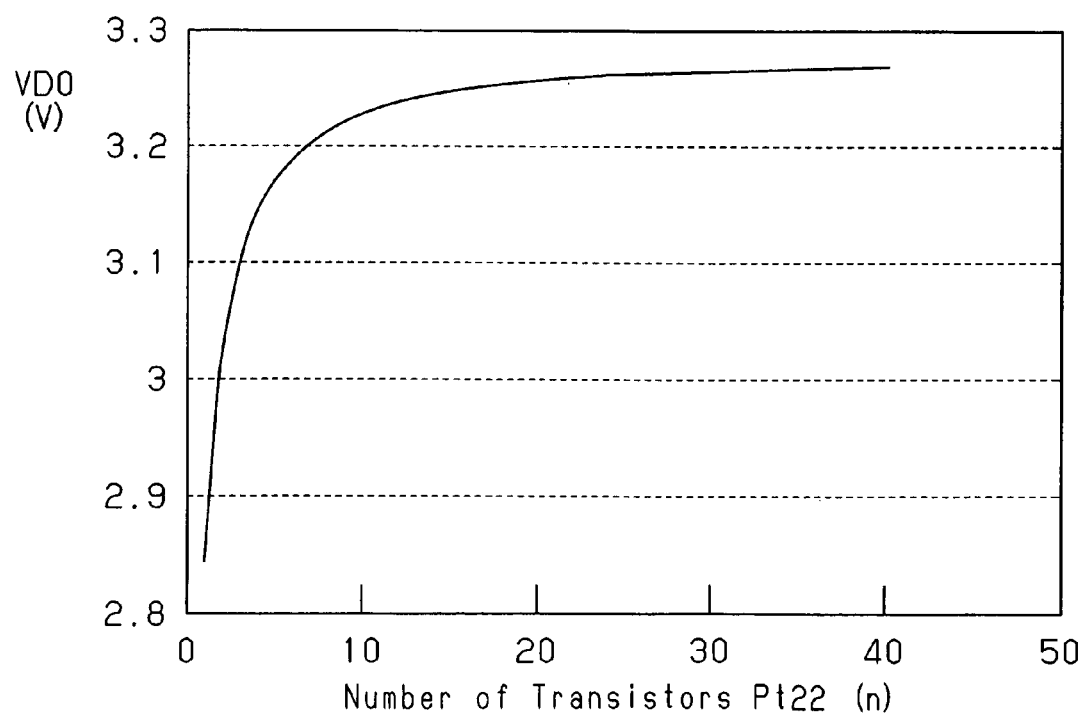
FIG. 12 is an operation characteristic graph of the power supply circuit.

In the same manner as the number (m) of transistors Pt21 configuring the transistor circuit Pt10, the number (parallel number: n) of transistors Pt22 configuring the protection circuit 21 is set so that the voltage difference of the reference voltage VD0 with respect to the high-potential power supply VDE is small. FIG. 12 is a graph showing the voltage of the reference voltage VD0 with respect to the number n of transistors Pt22 configuring the protection circuit 21. In the plurality of transistors Pt22 that are connected in parallel to one another, the voltage of the reference voltage VD0 approaches the high-potential power supply VDE, as shown in FIG. 12, since the substantial resistance of the protection circuit 21 decreases as the parallel number increases.

The protection circuit 21 connected between the transistor circuit Pt10 and the node N4 increases the on-resistance between the high-potential power supply VDE and the node N4. Thus, when electrostatic discharge (ESD) occurs at the input/output buffer 11, the substantial resistance between the high-potential power supply VDE and the node N4 becomes large compared to the prior art. This decreases the amount of current flowing to the transistor circuit Nt13 via the transistor circuit Pt10 and the protection circuit 21. Accordingly, there is no flow of current that connects the source and drain of the transistor circuit Nt13. This prevents damage (ESD damage) to the transistor circuit Nt13.

The on-resistance between the high-potential power supply VDE and the node N4 is increased by connecting the protection circuit 21 between the transistor circuit Pt10 and the node N4. The resistance of the protection circuit 21, however, increases the resistance between the high-potential power supply VDE and the node N4 that determines the current value flowing to the transistor circuit Nt13 when ESD occurs. That is, when the resistance of the protection circuit 21 increases, the strength withstanding ESD (breakdown voltage strength) increases. The number (parallel number) of transistors Pt22 configuring the protection circuit 21 is determined so as to balance the ESD breakdown voltage strength and the resistance (on-resistance) between the high-potential power supply VDE and the node N4. That is, the ESD breakdown voltage increases when the on-resistance is increased. However, the voltage difference between the reference voltage VD0 and the high-potential power supply VDE increases. On the other hand, when decreasing the on-resistance, the voltage difference between the voltage of the reference voltage VD0 and the high-potential power supply VDE decreases. However, the ESD breakdown voltage decreases. Thus, the ESD breakdown voltage is increased by raising the on-resistance within a range tolerating the voltage difference between the voltage of the reference voltage VD0 and the high-potential power supply VDE (e.g., voltage of high-potential power supply VDE of 3.3 V, and voltage of reference voltage VD0 of 3.28 V or greater).

The preferred embodiment has the advantages described below.

(1) The power supply circuit 16 includes the P-channel MOS transistor circuit Pt10 connected to the high-potential power supply VDE, the N-channel MOS transistor circuit Nt13 connected to the low-potential power supply VSS, and the protection circuit 21 connected between the two transistor circuits Pt10 and Nt13. The transistor circuit Pt10 generates the reference voltage VD0, which is close to the voltage of the high-potential power supply VDE. The on-resistance of the transistor circuit Pt10 is adjusted to be relatively small. The gate and the source of the transistor circuit Nt13 are connected to each other. This significantly reduces the leakage current flowing from the reference voltage VD0 to the low-potential power supply VSS. The voltage at the high-voltage terminal of the transistor circuit Nt13 is lowered by the resistance of the protection circuit 21. Compared to when a large current flows through the transistor Nt10 (first transistor circuit) during the occurrence of ESD, the current that flows to the transistor circuit Nt13 (second transistor circuit) is reduced. This prevents the second transistor circuit from being damaged.

(2) The power supply circuit 16 includes the MOS transistors Pt11 to Pt15, connected to the node N4 between the transistor circuit Pt10 and the transistor circuit Nt13, for decreasing the voltage of the external voltage signal EB to a predetermined voltage when voltage is not supplied from the high-potential power supply VDE and generating the reference voltage VD0. Thus, when voltage is not supplied from the operation power supply (high-potential power supply VDE), the circuit is protected from the voltage signal EB, which is provided from an external device.

It should be apparent to those skilled in the art that the present invention may be embodied in many other specific forms without departing from the spirit or scope of the invention. Particularly, it should be understood that the present invention may be embodied in the following forms.

In the preferred embodiment, in the same manner as the transistors Pt21 configuring the transistor circuit Pt10, the protection circuit 21 configured by the transistors Pt22, the gate terminals of which are connected in parallel to one another, is connected between the transistor circuit Pt10 and the node N4. However, such connection may be changed as required.

In the preferred embodiment, the elements and connection of the protection circuit 21 may be changed as required as long as the protection circuit 21 is provided with the function for moderating the current flowing to the transistor circuit Nt13 when ESD occurs.

Figure 13:
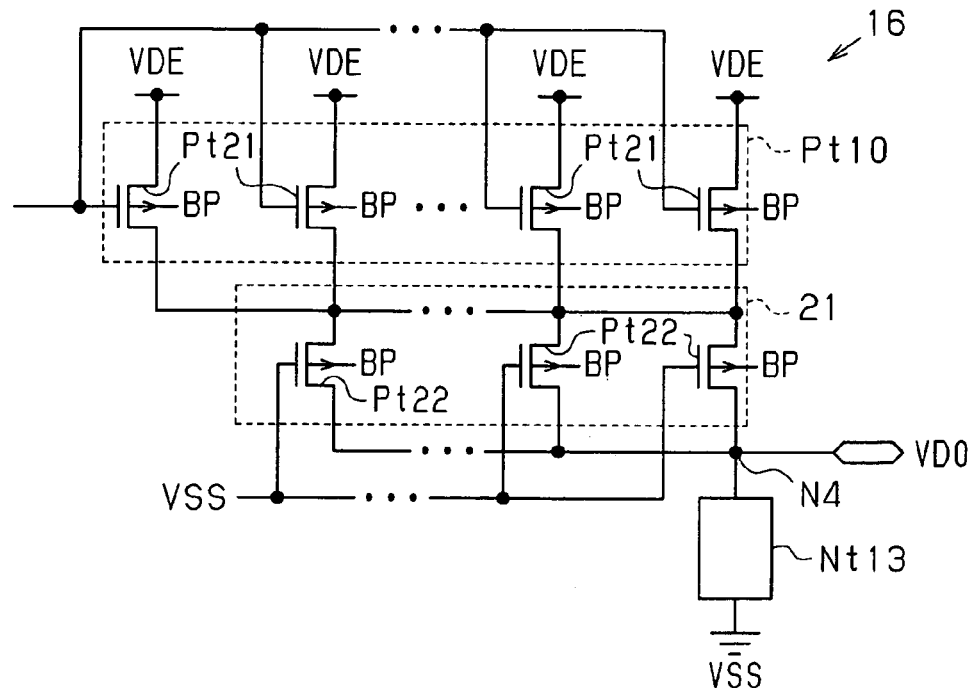
FIGS. 13 to 35 are partial circuit diagrams and operation characteristic graphs of other power supply circuits.
Figure 14:
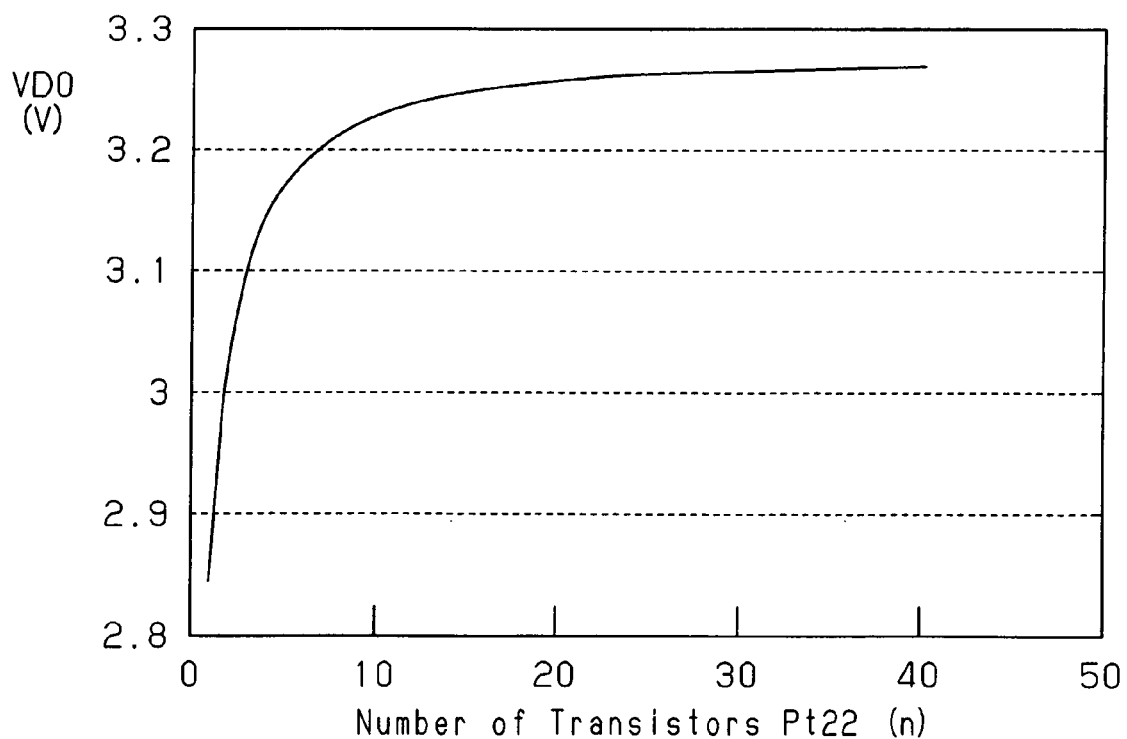

For example, the power supply circuit 16 may be modified as shown in FIG. 13. The transistors Pt22 configuring the protection circuit 21 of the power supply circuit 16 include gates connected to the low-potential power supply VSS. The transistors Pt22 connected in this manner are turned ON when the voltage at their sources is higher than that at their gates. The power supply circuit 16 has a characteristic in which the voltage of the reference voltage VD0 changes with respect to the number of transistors Pt22, as shown in FIG. 14. When ESD occurs, the resistance (on-resistance) corresponds to the voltage between the source and drain. Thus, current having a value determined by the resistance of the transistor Pt22 and the transistor circuit Pt10 flows to the transistor circuit Nt13 through the transistor circuit Pt10 and the protection circuit 21. Therefore, compared to when only the transistor circuit Pt10 is used, the protection circuit 21 reduces the current flowing to the transistor circuit Nt13. This prevents the transistor circuit Nt13 from being damaged.

Figure 15:
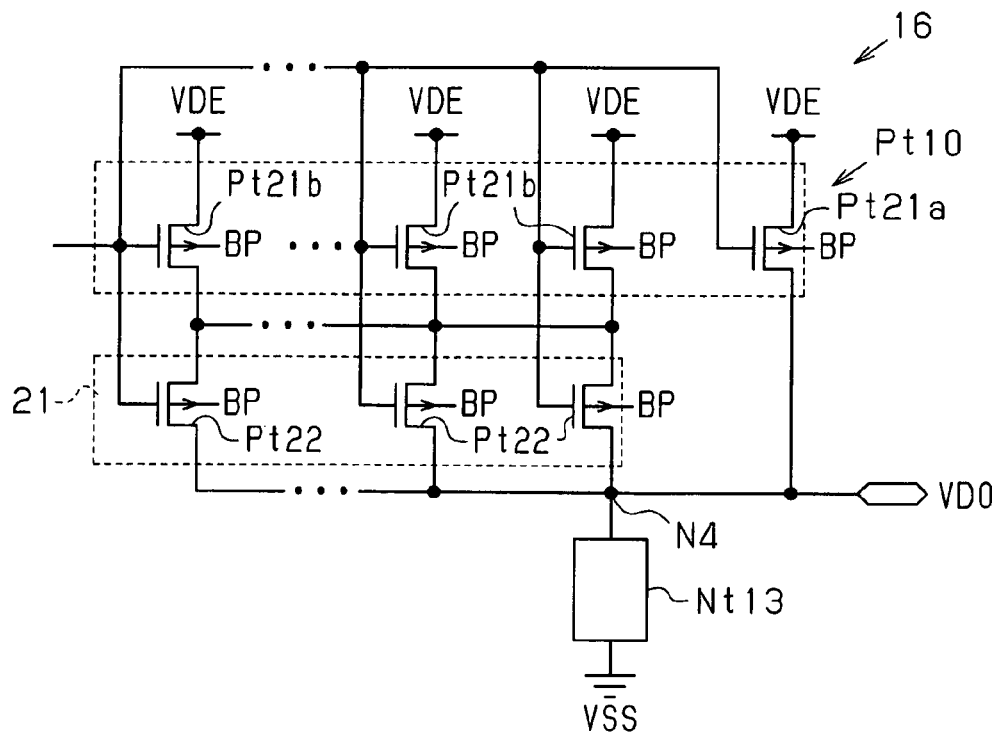
Figure 16:
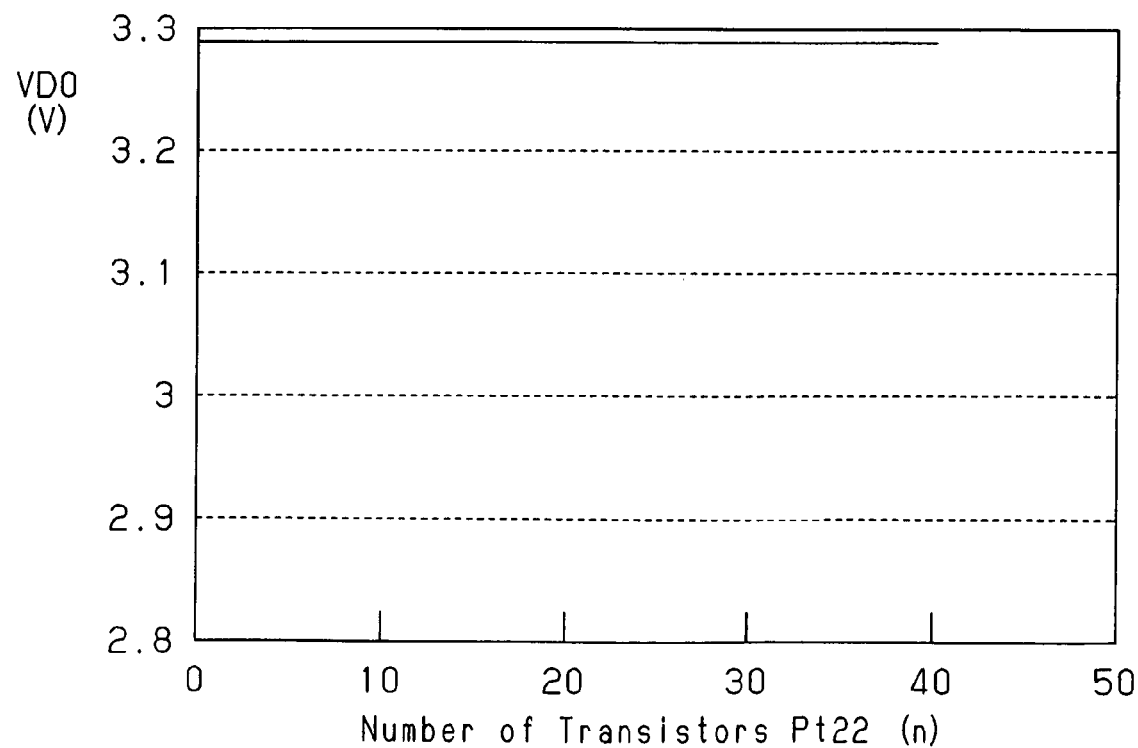

The power supply circuit 16 may be modified as shown in FIG. 15. The transistor circuit Pt10 (first transistor circuit) of the power supply circuit 16 is configured from at least one (m1) first transistor Pt21a, and at least one (m2) second transistor Pt21b. Therefore, the number m of transistors in the transistor circuit Pt10 is m1+m2. The drain of the first transistor Pt21a is connected to the node N4. The drain of each of the second transistors Pt21b is connected to the drain of another second transistor Pt21b and to the protection circuit 21. The number (m2) of the second transistors Pt21b is the same as the number (n) of the transistors Pt22 configuring the protection circuit 21. Therefore, the number m1 of the first transistor Pt21a is the difference between the number m of transistors in the transistor circuit Pt10 and the number n of transistors Pt22 configuring the protection circuit 21 (m−n≧1). As shown in FIG. 16, in the power supply circuit 16, the voltage of the reference voltage VD0 barely changes even if the number n of transistors Pt22 configuring the protection circuit 21 is changed. Therefore, the same advantages as the preferred embodiment are obtained even if the protection circuit 21 is configured by one transistor Pt22, and the transistor Pt22 is connected between one of the second transistors Pt21b and the node N4. In this case, since the protection circuit 21 is configured by one transistor Pt22, the ESD breakdown voltage of the buffer circuit is increased by adding a simple circuit. Further, the buffer circuit is smaller than that in the preferred embodiment. If there is only one transistor Pt22 in the protection circuit 21, the drain of the second transistor Pt21 is connected only to the source of the transistor Pt22.

Figure 17:
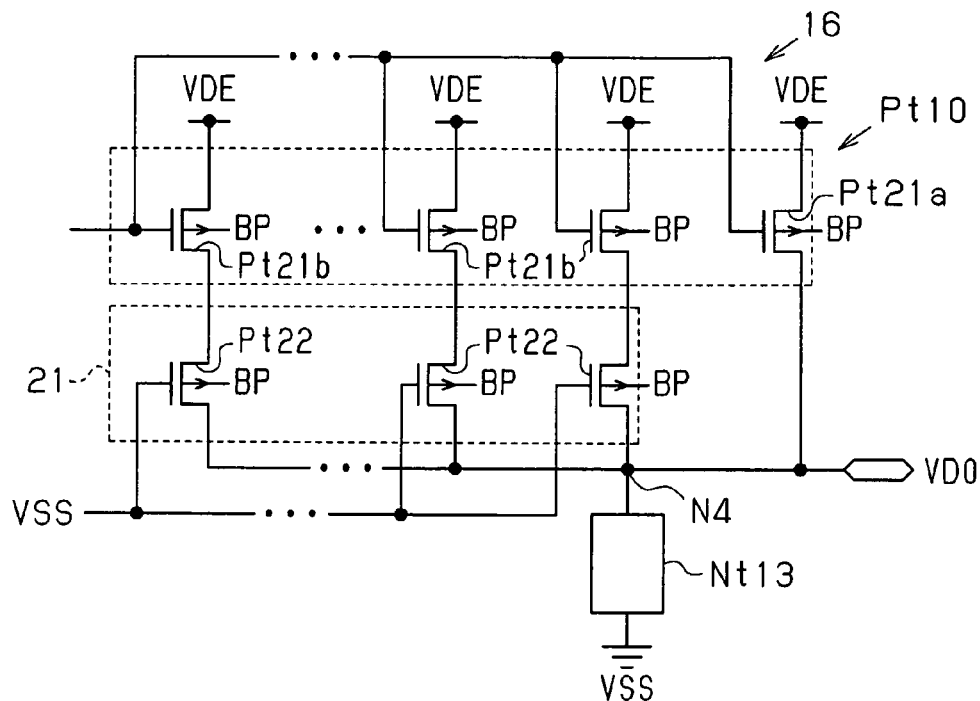
Figure 18:
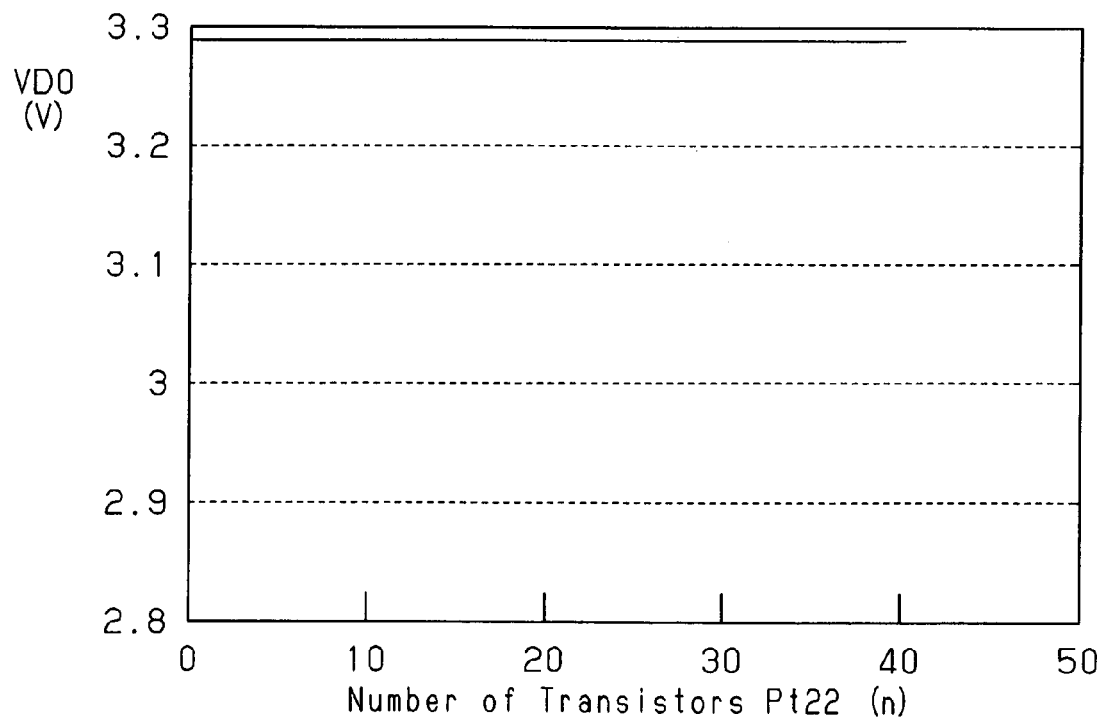

The power supply circuit 16 may be modified as shown in FIG. 17. In this power supply circuit 16, the transistor circuit Pt10 is configured by at least one first transistor Pt21a having a drain connected to the node N4, and a plurality of second transistors Pt21b having drains connected to the protection circuit 21. The number of the second transistors Pt21b is the same as the number of the transistors Pt22 configuring the protection circuit 21. The drain of each second transistor Pt21b is connected to the source of the corresponding transistor Pt22, and the gate of the transistor Pt22 is connected to the low-potential power supply VSS. The number m1 of the first transistors Pt21a and the number m2 of the second transistors Pt21 are determined in the same manner as in the power supply circuit 16 shown in FIG. 15. In this power supply circuit 16, the voltage of the reference voltage VD0 barely changes in accordance with the change in the number n of transistors Pt22 configuring the protection circuit 21, as shown in FIG. 18. Therefore, the same advantages as the power supply circuit 16 shown in FIG. 15 are obtained.

Figure 19:
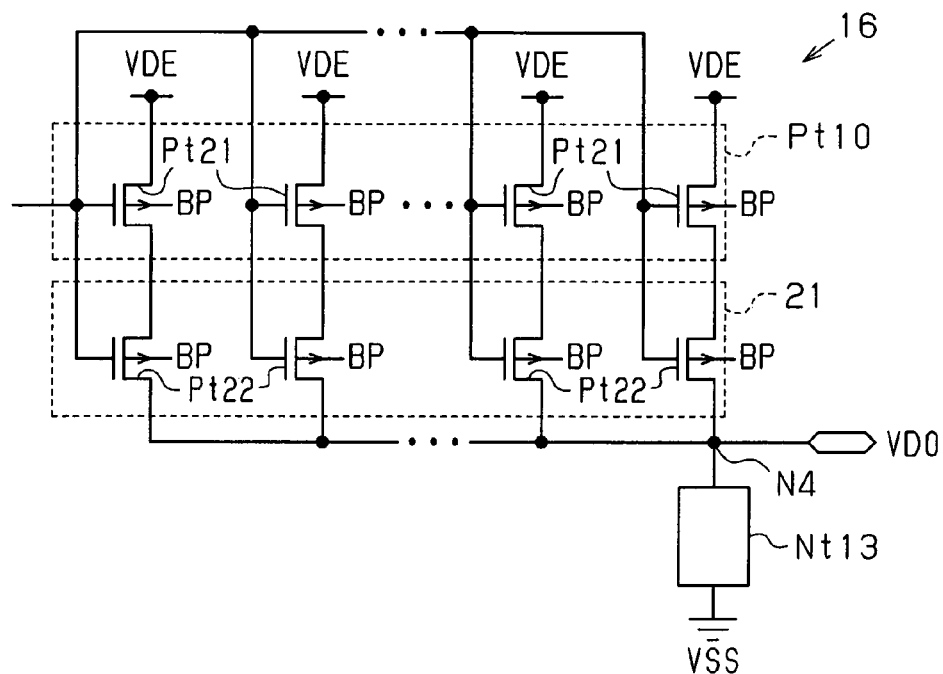
Figure 20:
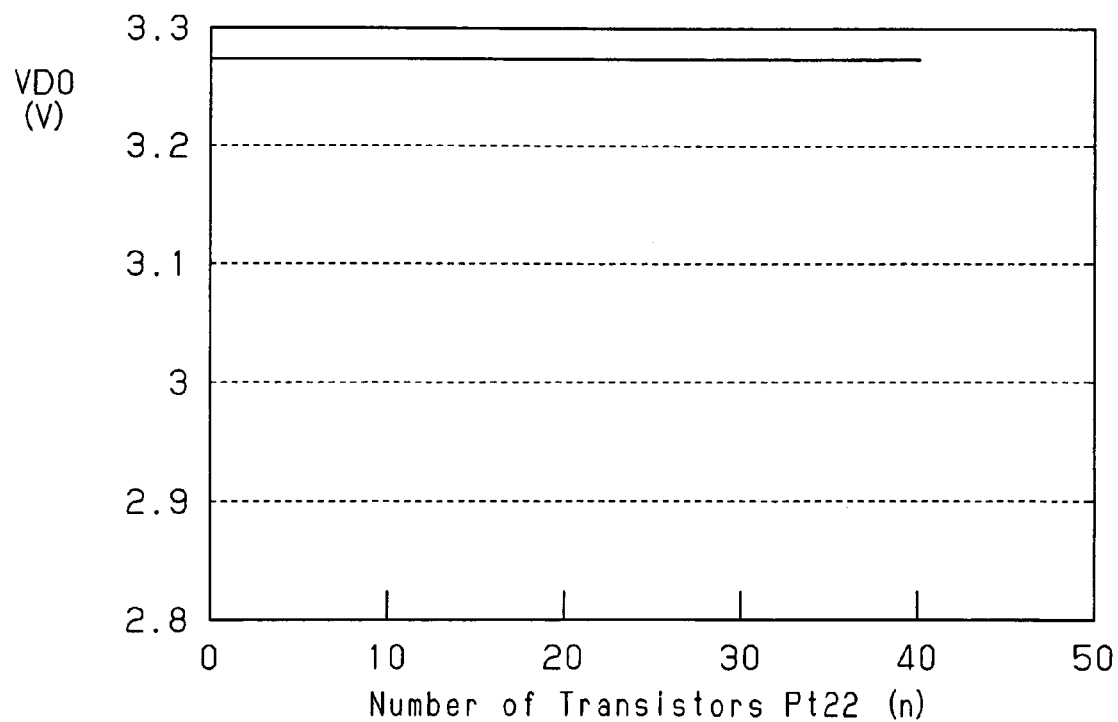

The power supply circuit 16 may be modified as shown in FIG. 19. In this power supply circuit 16, the transistor circuit Pt10 and the protection circuit 21 are configured by the same number of transistors. The drains of the plurality of (n number of) transistors Pt21 configuring the transistor circuit Pt10 are connected to the sources of the corresponding transistors Pt22. That is, the transistors Pt21 and Pt22 form pairs that are connected in series between the high-potential power supply VDE and the node N4. The transistor circuit Pt10 and the protection circuit 21 are configured by n pairs of transistors Pt21 and Pt22 that are connected in parallel to one another. The gates of the transistors Pt22 configuring the protection circuit 21 are connected to the gates of the transistors Pt21 configuring the transistor circuit Pt10. In this power supply circuit 16, the voltage of the reference voltage VD0 barely changes in accordance with the change in the number n of transistors Pt22 configuring the protection circuit 21, as shown in FIG. 20. Therefore, the power supply circuit 16 may be configured irrespective of the number of transistor pairs.

Figure 21:
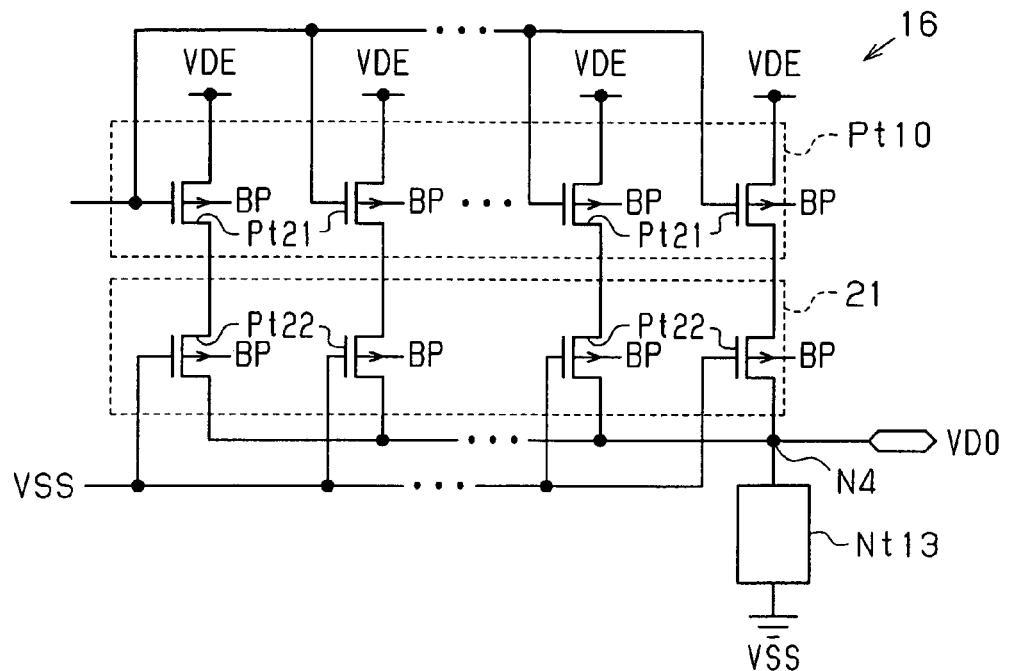
Figure 22:
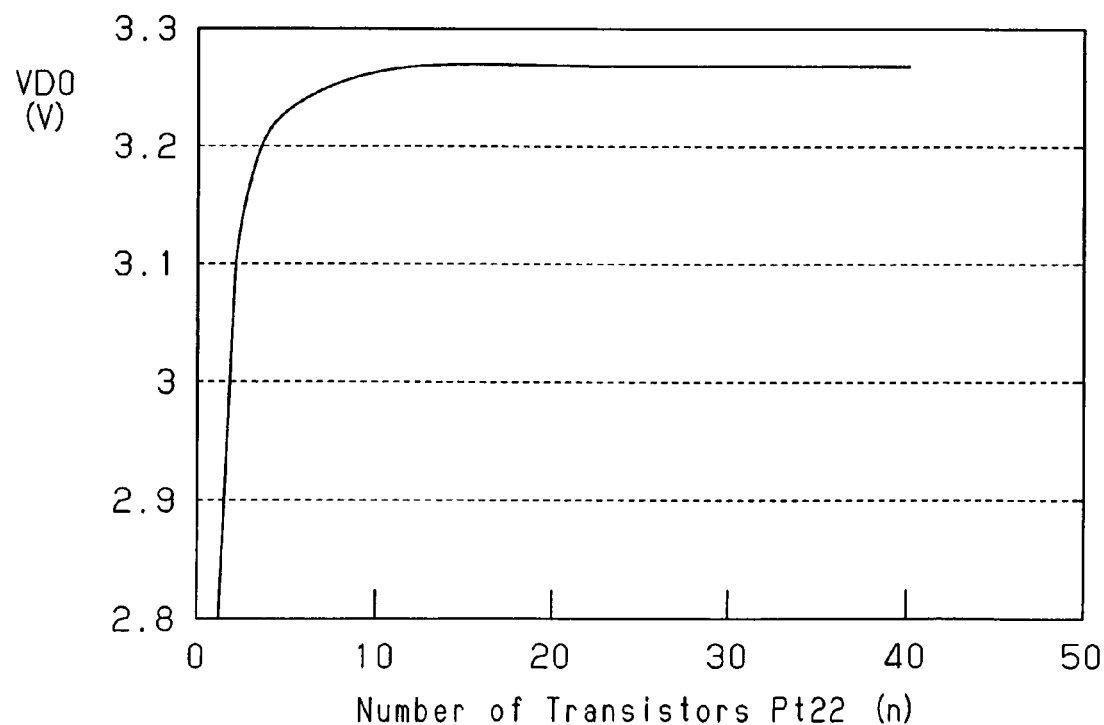

The power supply circuit 16 may be modified as shown in FIG. 21. In this example, the transistor circuit Pt10 includes an n number of transistors Pt21, and the protection circuit 21 includes an n number of transistors Pt22. The n number of transistors Pt21 and the n number of transistors Pt22 configure an n number of transistor pairs. The transistors Pt22 configuring the protection circuit 21 include gates connected to the low-potential power supply VSS. In this power supply circuit 16, the voltage of the reference voltage VD0 changes as the number n of transistor pairs changes, as shown in FIG. 22. The advantages of the preferred embodiment are obtained when n is, for example, greater than or equal to 30.

Figure 23:
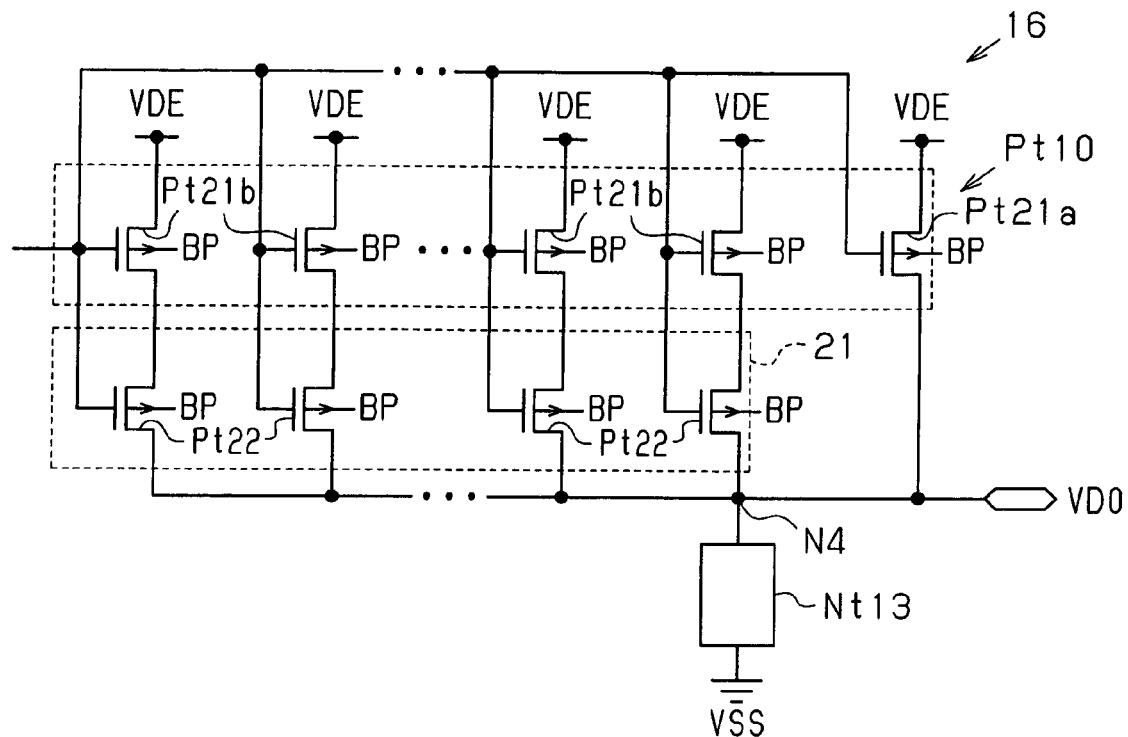
Figure 24:
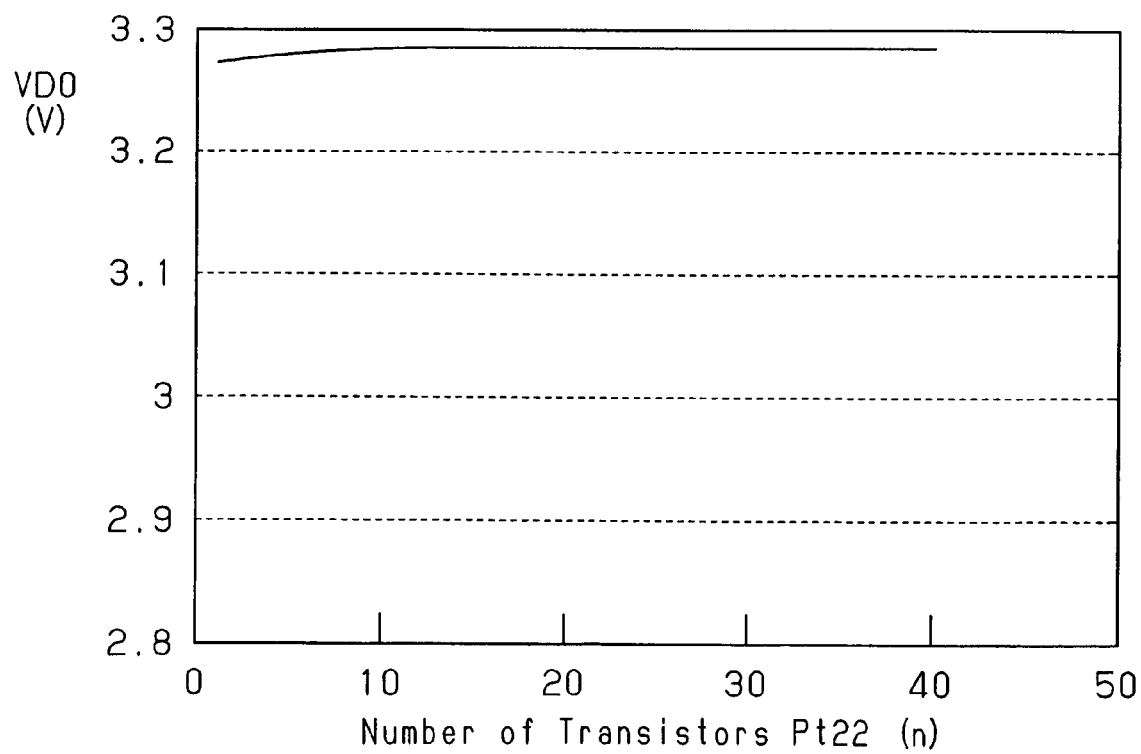

The power supply circuit 16 may be modified as shown in FIG. 23. In this power supply circuit 16, the transistor circuit Pt10 is configured by at least one (m1) first transistor Pt21a having a drain connected to the node N4, and at least one (m2) second transistor Pt21b having gates connected to each other and being connected to the protection circuit 21. Therefore, the number m of transistors in the transistor circuit Pt10 is m1+m2. The number (n) of the transistors Pt22 configuring the protection circuit 21 is the same as the number (m2) of second transistors Pt21b. Therefore, with respect to the number m of transistors configuring the transistor Pt10 and the number n (or m2) of transistors Pt22 configuring the protection circuit 21, the number m1 of the first transistor Pt21a is the difference between the number m of transistors configuring the transistor Pt10 and the number n of transistors Pt22 configuring the protection circuit 21 (m1=m−n≧1). The drain of the second transistor Pt21b is connected to the source of the corresponding transistor Pt22. The gate of such transistor Pt22 is connected to the gate of the second transistor Pt21b. That is, the transistors Pt21b and Pt22 connected in series between the high-potential power supply VDE and the node N4 form m2 (or n) sets of transistor pairs. In other words, the transistor circuit Pt10 is configured by an m1 number of first transistors Pt21a connected between the high-potential power supply VDE and the node N4, and the protection circuit 21 is configured by m2 (or n) sets of transistor pairs that are connected in series between the high-potential power supply VDE and the node N4. In such power supply circuit 16, the voltage of the reference voltage VD0 changes as the number n of transistors Pt22 configuring the protection circuit 21 changes, as shown in FIG. 24. Thus, the advantages of the preferred embodiment are obtained when, for example, the number n (or m2) of transistors Pt22 configuring the protection circuit 21 is greater than or equal to 10.

Figure 25:
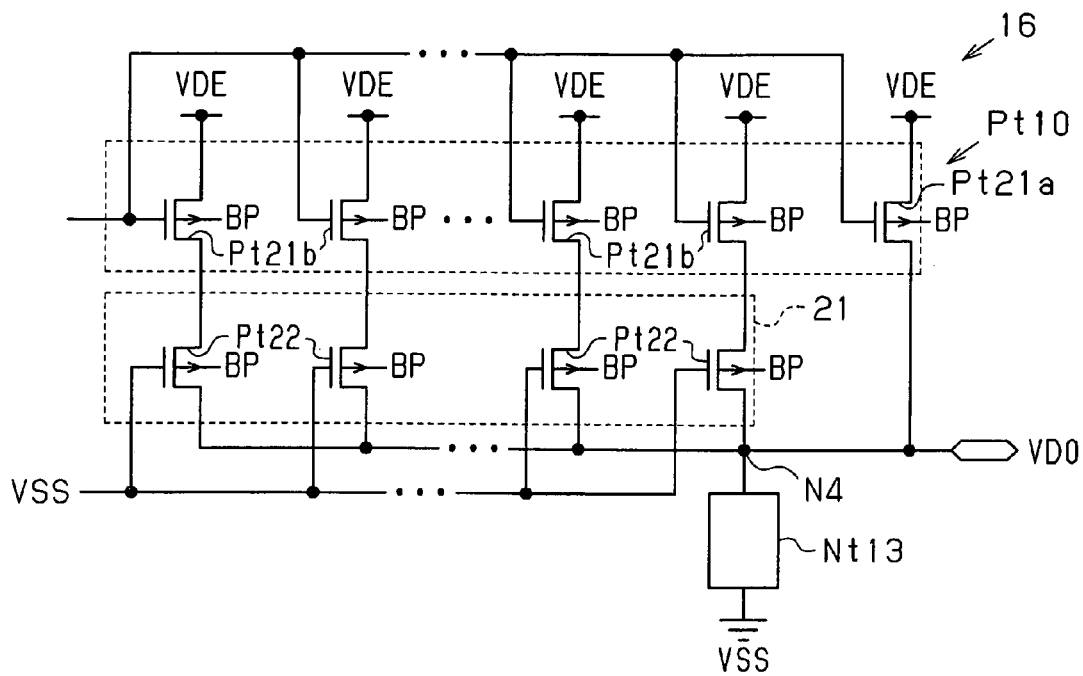
Figure 26:
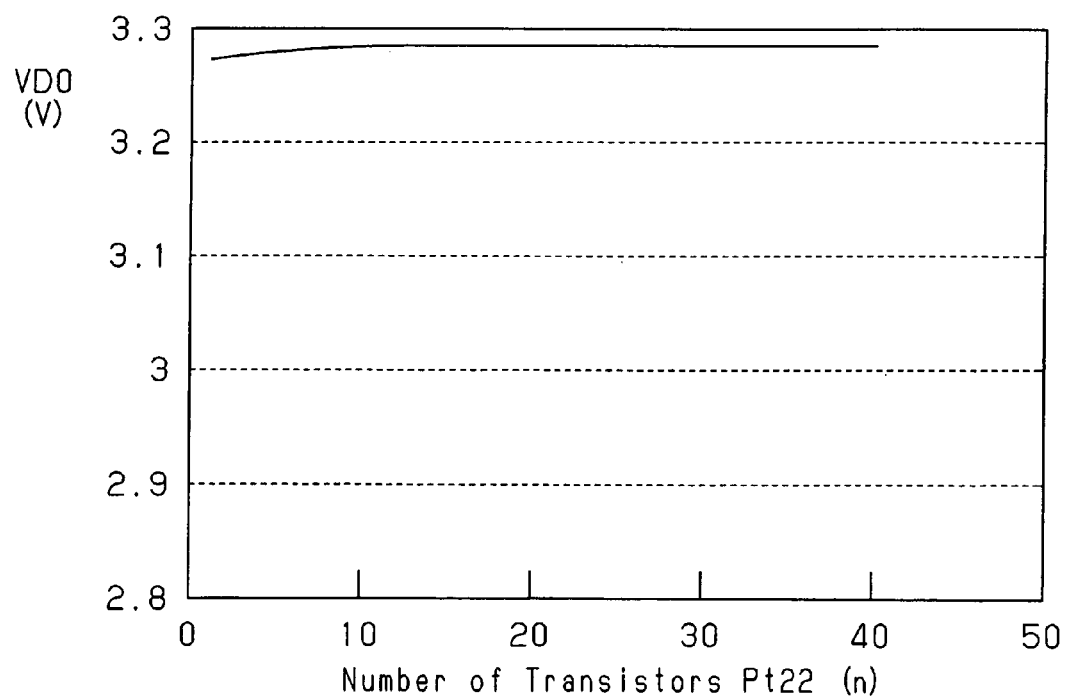

As shown in FIG. 25, the gates of the transistors Pt22 configuring the protection circuit 21 may be connected to the low-potential power supply VSS. This power supply circuit 16 has the same characteristics as the power supply circuit 16 shown in FIG. 23. As shown in FIG. 26, the same advantages as the preferred embodiment are obtained when the number n (or m2) of transistors Pt22 configuring the protection circuit 21 is greater than or equal to 10.

In the preferred embodiment, the protection circuit 21 is configured by a P-channel MOS transistor. However, the protection circuit 21 may be configured by N-channel MOS transistors.

Figure 27:
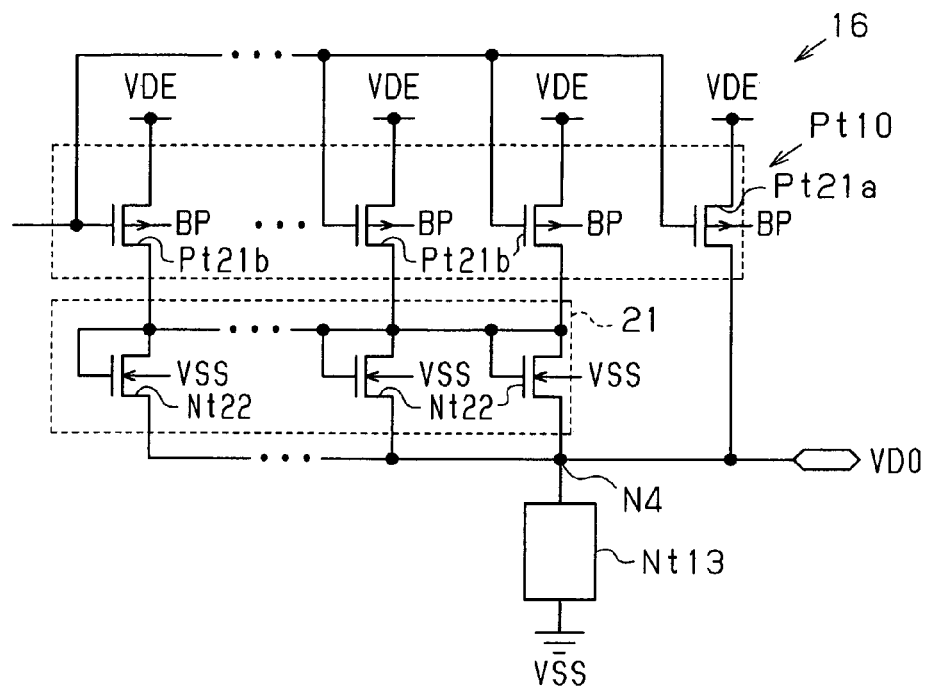
Figure 28:
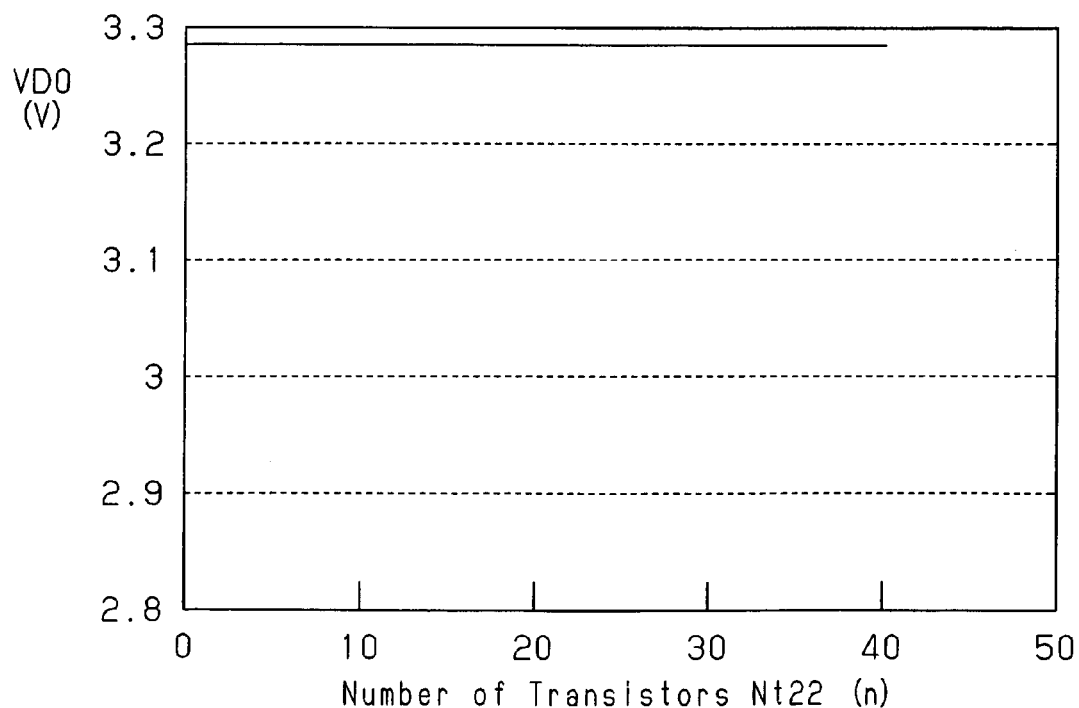

For example, the power supply circuit 16 may be configured, as shown in FIG. 27. In the same manner as the power supply circuit 16 shown in FIG. 15, in this power supply circuit 16, the drains of a plurality of second transistors Pt21b are connected to one another. The protection circuit 21 is configured by a plurality of transistors Nt22 including drains that are connected to one another. These drains are connected to the drains of the second transistor Pt21b. The gate and drain of each transistor Nt22 are connected to each other. The power supply circuit 16 has a characteristic in which the voltage of the reference voltage VD0 barely changes with respect to the number n (or m2) of transistors Nt22 configuring the protection circuit 21, as shown in FIG. 28. Therefore, the same advantages as the preferred embodiment are obtained irrespective of the number of transistors Nt22 configuring the protection circuit 21.

Figure 29:
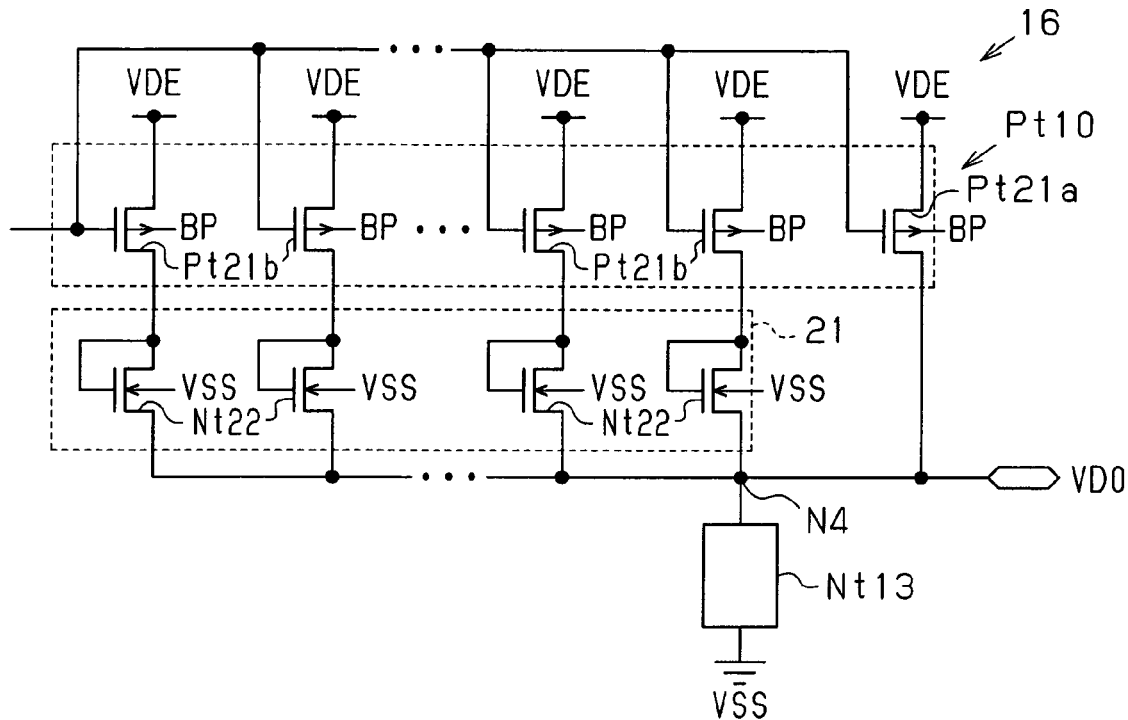
Figure 30:
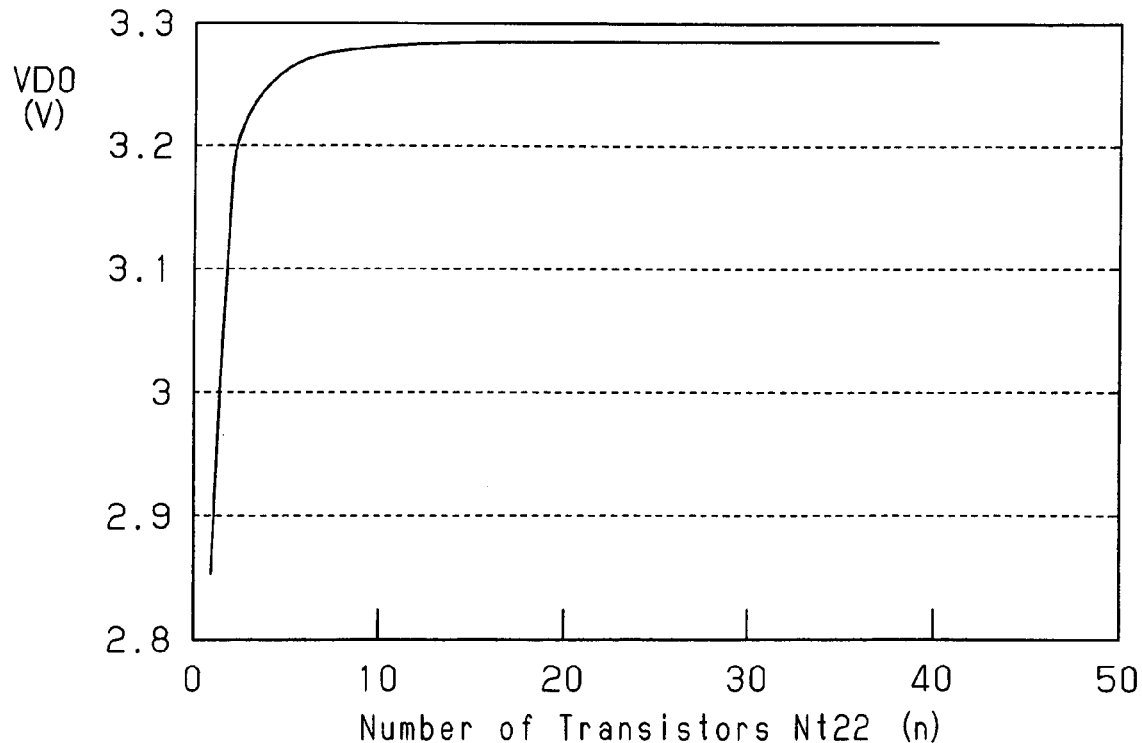

The power supply circuit 16 may be modified as shown in FIG. 29. In the same manner as the power supply circuit 16 shown in FIG. 17, this power supply circuit 16 has transistors Nt22, which configure the protection circuit 21, respectively connected to a plurality of second transistors Pt21b. That is, the m2 pairs of transistors Pt21b and Nt22, which are connected in series between the high-potential power supply VDE and the node N4 are connected parallel to one another. In this power supply circuit 16, the voltage of the reference voltage VD0 changes as the number n of transistors Nt22 configuring the protection circuit 21 changes, as shown in FIG. 30. Thus, the same advantages as the preferred embodiment are obtained when, for example, the number n (or m2) of transistors Nt22 configuring the protection circuit 21 is greater than or equal to 10.

Figure 31:
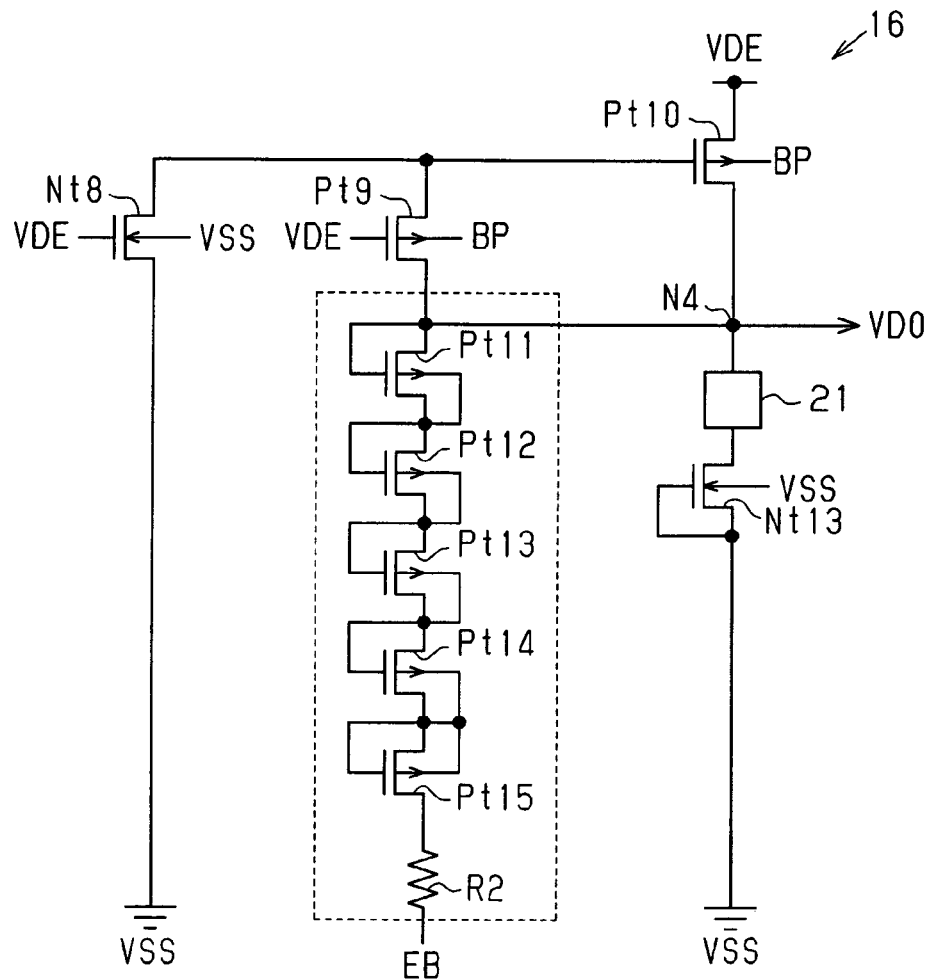

In the preferred embodiment and its modifications, the protection circuit 21 is arranged between the transistor circuit Pt10 and the node N4. However, the protection circuit 21 may be located anywhere as long as it is between the high-potential power supply VDE and the transistor circuit Nt13. In the example of FIG. 31, the protection circuit 21 is connected between the node N4 and the transistor circuit Nt13.

Figure 32:
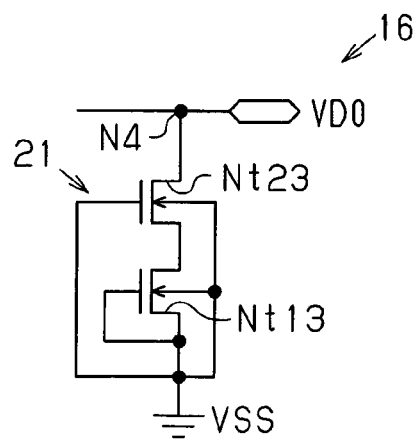
Figure 33:
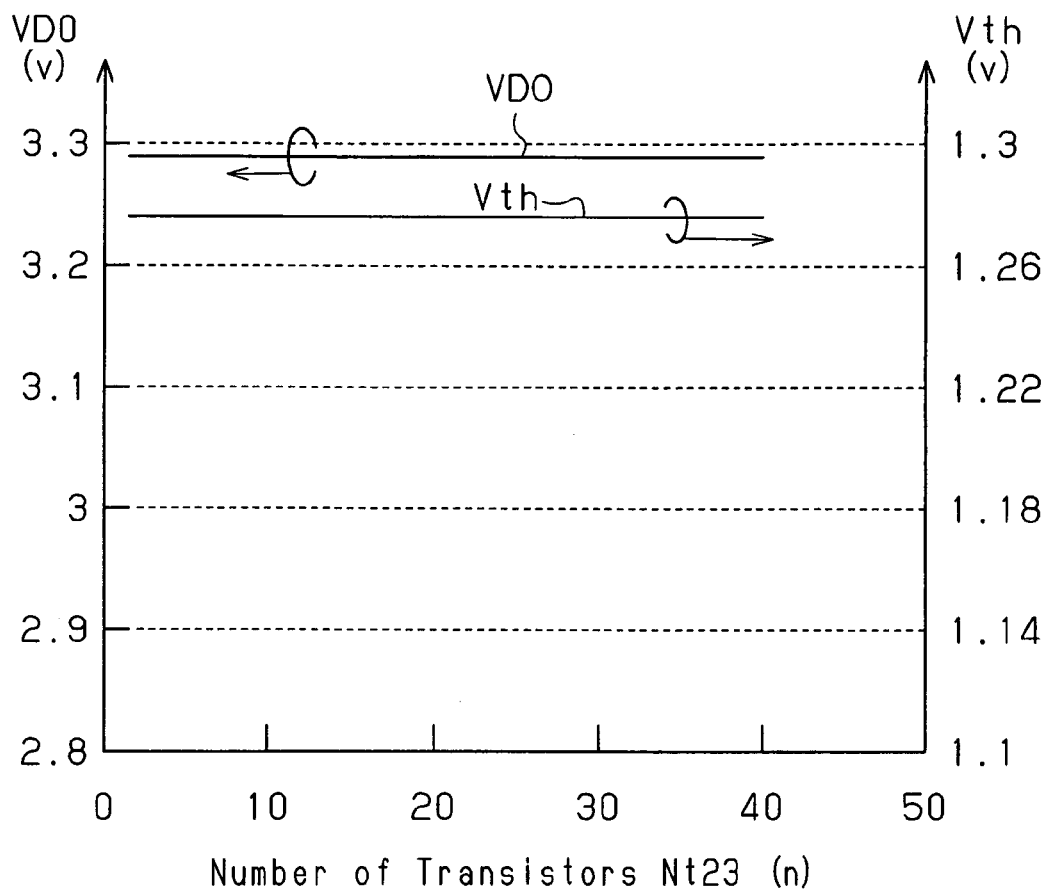

As shown in FIG. 32, the protection circuit 21 may be configured by at least one transistor Nt23 connected between the node N4 and the transistor circuit Nt13. If the protection circuit 21 is configured by two or more transistors Nt23, the transistors Nt23 are connected parallel to one another between the node N4 and the transistor circuit Nt13. The transistor Nt23 includes a gate and a source connected to the transistor circuit Nt13, a drain connected to the node N4, and a back gate connected to the low-potential power supply VSS. Such power supply circuit 16 has a characteristic in which the voltage of the reference voltage VD0 barely changes when the number n of transistors Nt23 configuring the protection circuit 21 changes, as shown in FIG. 33. Therefore, the same advantages as the preferred embodiment are obtained irrespective of the number of transistors Nt23 configuring the protection circuit 21.

Figure 34:
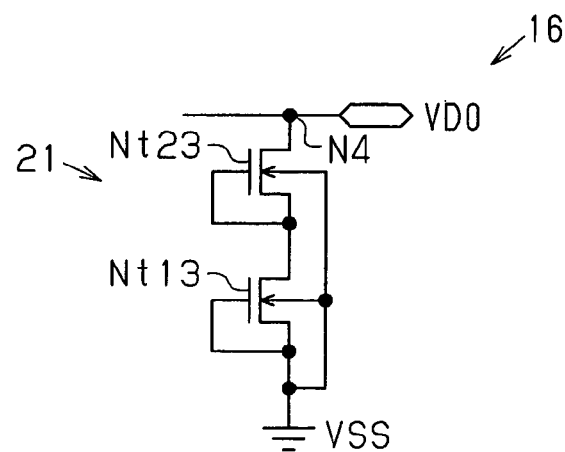
Figure 35:
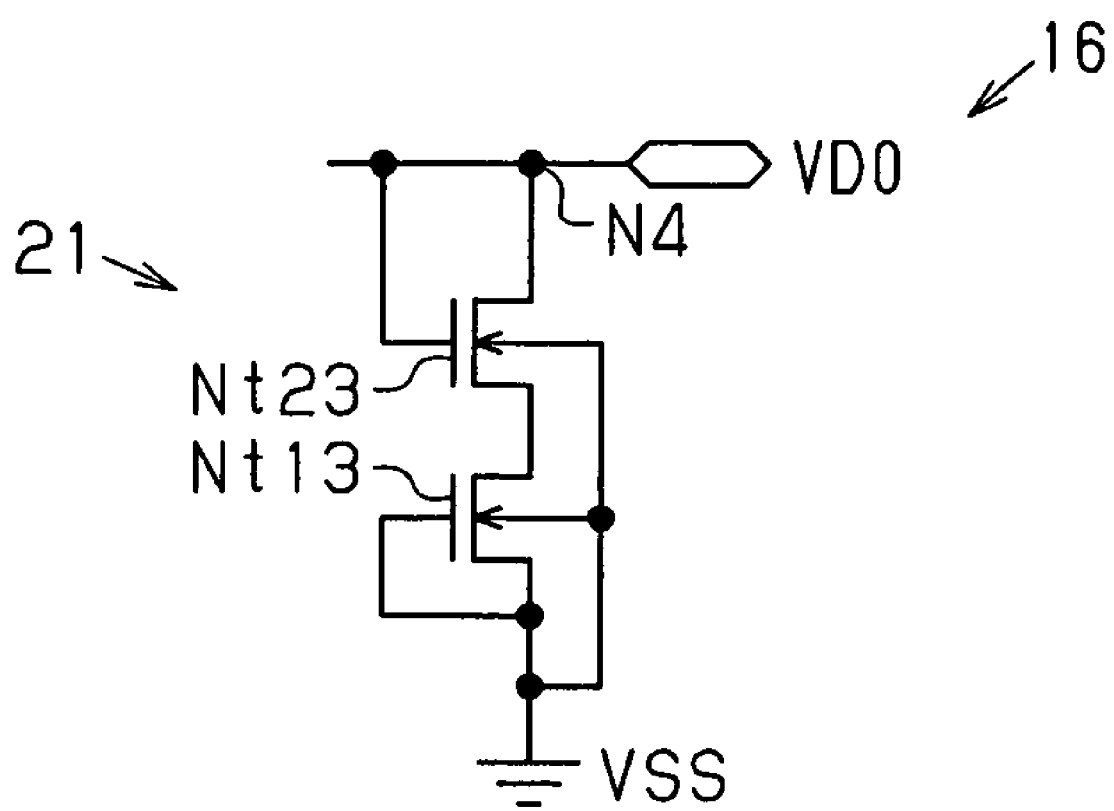

With regards to the transistor Nt23 configuring the protection circuit 21, the gate and the source may be connected to each other, as shown in FIG. 34. As shown in FIG. 35, the transistor Nt23 may include a gate connected to the node N4 (drain of the transistor Nt23). In the same manner as the power supply circuit 16 including the protection circuit 21 shown in FIG. 32, the power supply circuit 16 including such transistor Nt23 has a characteristic in which the voltage of the reference voltage VD0 barely changes as the number n of transistors Nt23 configuring the protection circuit 21 changes. Therefore, the same advantages as the preferred embodiment are obtained irrespective of the number of transistors Nt23 configuring the protection circuit 21.

In the preferred embodiment and its modifications, the transistor circuit Pt10 (refer to FIG. 11) having the multi-finger configuration includes source diffusion regions S and drain diffusion regions D shared by adjacent transistors Pt21. However, the transistor circuit Pt10 may have a configuration in which the source diffusion regions S and drain diffusion regions D are not shared. Similarly, the transistors Pt22, Nt22 configuring the protection circuit 21 may be configured so that the source diffusion regions S and drain diffusion regions D are not shared.

In the preferred embodiment and its modifications, the protection circuit is configured by P-channel or N-channel MOS transistors. However, any type of device may be used as long as it functions as a resistor for moderating the current flowing to the transistor circuit Nt13. For example, the protection circuit may be configured by a typical resistor or by a bipolar transistor (e.g., NPN transistor and PNP transistor).

In the preferred embodiment, the transistor circuit Pt10 is configured by a plurality of transistors Pt21 (first transistors Pt21a and second transistors Pt21b). However, the transistor circuit Pt10 may be configured by one transistor in which the gate width and the gate length are adjusted.

The preferred embodiment and modifications thereof may be applied to an input buffer that includes the input circuit 13 but not the output circuit 14 or to an output buffer that includes the output circuit 14 but not the input circuit 13.

It should be apparent to those skilled in the art that the present invention may be embodied in many other specific forms without departing from the spirit or scope of the invention. Therefore, the present invention is not to be limited to the details given herein, but may be modified within the scope and equivalence of the appended claims.

What is claimed is:

1. A buffer circuit for use with high-potential and low-potential power supplies, the buffer circuit comprising:
    a power supply circuit for generating reference voltage, the power supply circuit including:
    a first transistor circuit, connected to the high-potential power supply, having an on-resistance adjusted to be relatively small;
    a second transistor circuit, connected between the first transistor circuit and the low-potential power supply, including a gate and a source connected to each other, wherein the reference voltage is the voltage at a node between the first transistor circuit and the second transistor circuit; and
    a protection circuit, directly connected to both of the first transistor circuit and the second transistor circuit, having sufficient resistance for reducing current flowing to the second transistor circuit, wherein the buffer circuit outputs the reference voltage from a node between the first transistor circuit and the protection circuit or a node between the second transistor circuit and the protection circuit.

2. The buffer circuit according to claim 1, wherein:
    the first transistor circuit includes an m number of first transistors, with m≧1, each including a gate, a first terminal and a second terminal, in which the first terminal of each of the first transistors is connected to the high-potential power supply, the gate of each of the first transistors is connected to the gate of another first transistor, and the second terminal of each of the first transistors is connected to the second terminal of another first transistor; and
    the protection circuit includes an n number of devices, with n≧1, each connected between the second terminal of the m number of first transistors and the node.

3. The buffer circuit according to claim 2, wherein each of the devices is a P-channel MOS transistor, in which the gate of each P-channel MOS transistor is connected to the gate of each of the first transistors or the low-potential power supply.

4. The buffer circuit according to claim 2, wherein each of the devices is an N-channel MOS transistor including a gate and a drain connected to each other.

5. The buffer circuit according to claim 1, wherein: the first transistor circuit includes an m number of first transistors, with m≧1, each including a gate, a first terminal, and a second terminal, in which the first terminal of each of the first transistors is connected to the high-potential power supply, and the gate of each of the first transistors is connected to the gate of another first transistor; and
    the protection circuit includes an n number of devices, with n≧1 and m>n, the n number of devices being connected to an n number of first transistors among the m number of first transistors, and the second terminal of the m-n number of first transistors among the m number of first transistors being connected to the node.

6. The buffer circuit according to claim 5, wherein each of the devices is a P-channel MOS transistor, in which the gate of each P-channel MOS transistor is connected to the gate of each of the first transistors or the low-potential power supply.

7. The buffer circuit according to claim 5, wherein each of the devices is an N-channel MOS transistor including a gate and a drain connected to each other.

8. The buffer circuit according to claim 1, wherein:
    the first transistor circuit includes an n number of first transistors, with n≧1, each including a first terminal, a second terminal, and a gate, in which the first terminal of each of the first transistors is connected to the high-potential power supply, the gate of each of the first transistors is connected to the gate of another first transistor; and
    the protection circuit includes n number of devices, each device being connected between the second terminal of each of the first transistors and the node.

9. The buffer circuit according to claim 8, wherein each of the devices is a P-channel MOS transistor, in which the gate of each P-channel MOS transistor is connected to the gate of each of the first transistors or the low-potential power supply.

10. The buffer circuit according to claim 8, wherein each of the devices is an N-channel MOS transistor including a gate and a drain connected to each other.

11. The buffer circuit according to claim 1, wherein:
    the first transistor includes an n number of first transistors;
    the protection circuit includes n number of third transistors, the n number of first transistors and the n number of third transistors configuring n number of transistor pairs, the n number of transistor pairs each being connected in series between the high-potential power supply and the node.

12. The buffer circuit according to claim 11, wherein each of the third transistors is a P-channel MOS transistor, in which the gate of each P-channel MOS transistor is connected to the gate of each of the first transistors or the low-potential power supply.

13. The buffer circuit according to claim 11, wherein each of the third transistors is an N-channel MOS transistor including a gate and a drain connected to each other.

14. The buffer circuit according to claim 1, wherein the protection circuit includes at least one device connected between the node and the second transistor circuit.

15. The buffer circuit according to claim 14, wherein the at least one device is an N-channel MOS transistor including a gate connected to one of the node, the low-potential power supply, and the drain of the second transistor circuit.

16. The buffer circuit according to claim 1, wherein the protection circuit is connected to the node and includes a plurality of MOS transistors for decreasing voltage of an external voltage signal to a predetermined voltage to generate the reference voltage when the high-potential power supply stops supplying high-potential power.

17. The buffer circuit according to claim 16, further comprising:
an input circuit, operated by the reference voltage, for generating a voltage signal having voltage lower than the voltage of the external voltage signal in accordance with the external voltage signal, and providing the voltage signal to an internal circuit.

18. The buffer circuit according to claim 17 further comprising:
a tolerant circuit, having voltage of the high-potential power supply when the external voltage signal is a voltage less than or equal to the high-potential power supply, for generating a voltage signal having voltage derived from the external voltage signal when the external voltage signal is a voltage higher than the high-potential power supply, and for providing the voltage signal to the input circuit and the power supply circuit.

19. The buffer circuit according to claim 16, further comprising:
an output circuit for generating a control signal corresponding to a data signal provided from the internal circuit; and
an input/output circuit, operated based on the reference voltage, for providing a voltage signal generated based on the control signal to an external device.

20. The buffer circuit according to claim 19 further comprising:
a tolerant circuit for providing a voltage signal to the input/output circuit and the power supply circuit, the tolerant circuit generating the voltage signal having voltage that is same as the voltage of the high-potential power supply when the external voltage signal has a voltage less than or equal to the voltage of the high-potential power supply, and the tolerant circuit generating the voltage signal having voltage corresponding to the external voltage signal when the external voltage signal has a voltage higher than the voltage of the high-potential power supply.

21. The buffer circuit according to claim 16, further comprising:
an input circuit, operated based on the reference voltage, for generating a voltage signal having voltage lower than the voltage of the external voltage signal in accordance with the external voltage signal and providing the voltage signal to an internal circuit;
an output circuit for generating a control signal corresponding to a data signal provided from the internal circuit; and
an input/output circuit, operated based on the reference voltage, for providing a voltage signal generated based on the control signal to an external device.

22. A buffer circuit for use with high-potential and low-potential power supplies, the buffer circuit comprising:
a power supply circuit for generating reference voltage, the power supply circuit including:
a first transistor circuit, connected to the high-potential power supply, having an on-resistance adjusted to be relatively small;
a second transistor circuit, connected between the first transistor circuit and the low-potential power supply, including a gate and a source connected to each other, wherein the reference voltage is the voltage at a node between the first transistor circuit and the second transistor circuit; and a protection circuit, directly connected to both of the first transistor circuit and the second transistor circuit, having sufficient resistance for reducing current flowing to the second transistor circuit, wherein:
the first transistor circuit includes an m number of first transistors, with $m \geq 1$, each including a gate, a first terminal and a second terminal, in which the first terminal of each of the first transistors is connected to the high-potential power supply, the gate of each of the first transistors is connected to the gate of another first transistor, and the second terminal of each of the first transistors is connected to the second terminal of another first transistor; and
the protection circuit includes an n number of devices, with $n \geq 1$, each connected between the second terminal of the m number of first transistors and the node.

23. A buffer circuit for use with high-potential and low-potential power supplies, the buffer circuit comprising:
a power supply circuit for generating reference voltage, the power supply circuit including:
a first transistor circuit, connected to the high-potential power supply, having an on-resistance adjusted to be relatively small;
a second transistor circuit, connected between the first transistor circuit and the low-potential power supply, including a gate and a source connected to each other, wherein the reference voltage is the voltage at a node between the first transistor circuit and the second transistor circuit; and
a protection circuit, directly connected to both of the first transistor circuit and the second transistor circuit, having sufficient resistance for reducing current flowing to the second transistor circuit, wherein:
the first transistor circuit includes an m number of first transistors, with $m \geq 1$, each including a gate, a first terminal, and a second terminal, in which the first terminal of each of the first transistors is connected to the high-potential power supply, and the gate of each of the first transistors is connected to the gate of another first transistor; and
the protection circuit includes an n number of devices, with $n \geq 1$ and $m > n$, the n number of devices being connected to an n number of first transistors among the m number of first transistors, and the second terminal of the m-n number of first transistors among the m number of first transistors being connected to the node.

24. A buffer circuit for use with high-potential and low-potential power supplies, the buffer circuit comprising:
a power supply circuit for generating reference voltage, the power supply circuit including:

a first transistor circuit, connected to the high-potential power supply, having an on-resistance adjusted to be relatively small;
a second transistor circuit, connected between the first transistor circuit and the low-potential power supply, including a gate and a source connected to each other, wherein the reference voltage is the voltage at a node between the first transistor circuit and the second transistor circuit; and
a protection circuit, directly connected to both of the first transistor circuit and the second transistor circuit, having sufficient resistance for reducing current flowing to the second transistor circuit, wherein:
the first transistor circuit includes an n number of first transistors, with $n \geq 1$, each including a first terminal, a second terminal, and a gate, in which the first terminal of each of the first transistors is connected to the high-potential power supply, the gate of each of the first transistors is connected to the gate of another first transistor; and
the protection circuit includes n number of devices, each device being connected between the second terminal of each of the first transistors and the node.

25. A buffer circuit for use with high-potential and low-potential power supplies, the buffer circuit comprising:

a power supply circuit for generating reference voltage, the power supply circuit including:
a first transistor circuit, connected to the high-potential power supply, having an on-resistance adjusted to be relatively small;
a second transistor circuit, connected between the first transistor circuit and the low-potential power supply, including a gate and a source connected to each other, wherein the reference voltage is the voltage at a node between the first transistor circuit and the second transistor circuit; and
a protection circuit, directly connected to both of the first transistor circuit and the second transistor circuit, having sufficient resistance for reducing current flowing to the second transistor circuit, wherein the protection circuit is connected to the node and includes a plurality of MOS transistors for decreasing voltage of an external voltage signal to a predetermined voltage to generate the reference voltage when the high-potential power supply stops supplying high-potential power.

* * * * *